United States Patent
Daren et al.

(10) Patent No.: US 10,982,109 B2
(45) Date of Patent: Apr. 20, 2021

(54) TWO-COMPONENT PRINTABLE CONDUCTIVE COMPOSITION

(71) Applicant: PRINTCB LTD., Ness-Ziona (IL)

(72) Inventors: Sagi Daren, Jerusalem (IL); Yiftah Karni, Rehovot (IL); Steve Daren, Ness-Ziona (IL)

(73) Assignee: PRINTCB LTD., Ness-Ziona (IL)

( * ) Notice: Subject to any disclaimer, the term of this patent is extended or adjusted under 35 U.S.C. 154(b) by 0 days.

(21) Appl. No.: 16/623,567

(22) PCT Filed: Dec. 19, 2018

(86) PCT No.: PCT/IL2018/051375
§ 371 (c)(1),
(2) Date: Dec. 17, 2019

(87) PCT Pub. No.: WO2019/175859
PCT Pub. Date: Sep. 19, 2019

(65) Prior Publication Data
US 2021/0047532 A1 Feb. 18, 2021

Related U.S. Application Data

(60) Provisional application No. 62/643,184, filed on Mar. 15, 2018.

(51) Int. Cl.
| | |
|---|---|
| C09D 11/52 | (2014.01) |
| C09D 11/037 | (2014.01) |
| C09D 11/033 | (2014.01) |
| C09D 11/08 | (2006.01) |
| C09D 11/36 | (2014.01) |
| C09D 11/38 | (2014.01) |
| H05K 1/09 | (2006.01) |
| H05K 3/12 | (2006.01) |
| C09D 11/322 | (2014.01) |

(52) U.S. Cl.
CPC ............ C09D 11/52 (2013.01); C09D 11/033 (2013.01); C09D 11/037 (2013.01); C09D 11/08 (2013.01); C09D 11/322 (2013.01); C09D 11/36 (2013.01); C09D 11/38 (2013.01); H05K 1/097 (2013.01); H05K 3/125 (2013.01); *H05K 2203/1131* (2013.01)

(58) Field of Classification Search
None
See application file for complete search history.

(56) References Cited

U.S. PATENT DOCUMENTS

| | | | |
|---|---|---|---|
| 4,559,166 A * | 12/1985 | Morinaga | ............... C08K 3/08 252/500 |
| 5,085,365 A | 2/1992 | Turner | |
| 5,376,403 A | 12/1994 | Capote | |
| 5,716,663 A | 2/1998 | Capote | |
| 5,830,389 A | 11/1998 | Capote | |
| 5,853,622 A | 12/1998 | Gallagher | |
| 5,922,397 A | 7/1999 | Brandt | |
| 6,132,646 A | 10/2000 | Zhou | |
| 9,005,330 B2 | 4/2015 | Shearer | |
| 10,446,412 B2 * | 10/2019 | Karni | ............... H01L 23/49883 |
| 2003/0109846 A1 | 6/2003 | Zinger | |
| 2012/0228560 A1* | 9/2012 | Jang | ......................... C09J 9/02 252/514 |
| 2015/0037550 A1* | 2/2015 | Balasubramaniam | ...................... H01B 13/0026 428/208 |
| 2015/0201500 A1 | 7/2015 | Shinar | |
| 2015/0218391 A1 | 8/2015 | Takahashi | |
| 2016/0151864 A1* | 6/2016 | Rector | ............... B23K 35/3006 428/615 |
| 2017/0128113 A1 | 5/2017 | Vogt | |

FOREIGN PATENT DOCUMENTS

| | | |
|---|---|---|
| EP | 0793405 A2 | 9/1997 |
| JP | 5887330 B2 | 3/2016 |
| WO | 9808362 A1 | 2/1998 |
| WO | 0059645 A1 | 10/2000 |
| WO | 2013090570 A1 | 6/2013 |
| WO | 2016166751 A1 | 10/2016 |
| WO | 2018207177 A1 | 11/2018 |

OTHER PUBLICATIONS

English translation of JP 2015/123472, Jul. 2015; 14 pages.*

* cited by examiner

*Primary Examiner* — Helene Klemanski
(74) *Attorney, Agent, or Firm* — J.A. Lindeman & Co., PLLC

(57) ABSTRACT

The present invention provides a two-component printable conductive composition comprising, as separate components, a metallic component comprising a high melting point (HMP) metal or metal alloy powder having a mean particle size below about 15 μm; and a fluxing component comprising an organic acid and an organic solvent. The organic acid is characterized by having at least two carboxylic groups and a first logarithmic acid dissociation constant (p $K_{a1}$) of at most about 4. These two components are manufactured and stored separately and are mixed together shortly before the combined conductive composition is used for printing. Further provided is a kit comprising the two-component composition, wherein the metallic component and the fluxing component are disposed in separate containers. The present invention further provides a method for deposition and patterning of the two-component composition, comprising: mixing the metallic component with the fluxing component; and applying the obtained mixture to an insulating substrate.

26 Claims, 2 Drawing Sheets

TWO-COMPONENT PRINTABLE CONDUCTIVE COMPOSITION

FIELD OF THE INVENTION

The present invention relates to two-component printable conductive compositions and kits for use in printed electronics (PE) and printed circuit boards (PCBs).

BACKGROUND OF THE INVENTION

Printed Electronics (PEs) is a set of printing methods used to create electronic devices by defining patterns on various substrates, utilizing widespread and low-cost techniques, such as screen printing, flexography, gravure, offset lithography, dispensing, Laser Assisted Forward Transfer, imprinting or inkjet printing. In these methods, electrically functional electronic or optical inks are deposited on a substrate, creating active or passive devices, such as RFID (Radio Frequency Identification) devices, displays, solar cells, heaters, electrodes, batteries, key pads, switches, sensors, medical devices, printed circuit boards (PCBs), keyboards, antennas, electronic skin patches, coils, resistors, and packaging. Printed electronics is one of the fastest growing technologies today and is becoming invaluable to several industries including healthcare, aerospace, IOT (Internet of Things), media, and transportation, as well as electrical devices such as heaters and printed electrical conductors on electrical products.

The attraction of printing technology for the fabrication of electronics mainly results from the possibility of printing conductive traces on insulating materials in a much simpler and cost-effective way compared to conventional PCB manufacturing. The selection of the printing method used is determined by requirements concerning printed layers, by the properties of printed materials, as well as economic and technical considerations of the final printed products. Current printed electronics technology typically requires conductive traces of 15 µm or less in thickness. Furthermore, many applications use low temperature substrates such as polyethylene terephthalate (PET). As a result, any high temperature processing including curing or sintering should be performed at temperatures below 150° C.

Both organic and inorganic materials can be used for printed electronics to produce conductors, semiconductors, dielectrics, or insulators. Ink materials can be in a liquid form, in a form of solution, paste, dispersion or suspension. Electronic functionality and printability can interfere with each other, mandating careful optimization. For printing, viscosity, surface tension and solid content must be tightly controlled. Cross-layer interactions such as wetting, adhesion, and solubility, as well as post-deposition drying procedures affect the outcome. Incorporation of additives which are commonly used in conventional printing inks is undesirable, since they may affect conductive properties.

A conductive ink is a low to medium viscosity fluid that typically comprises solvents, resins and fillers. Solvents transform the ink to a liquid state and regulate the drying profile of the ink. Resins regulate the mechanical properties of the ink, such as adhesion to the substrate or mechanical strength. Fillers typically comprise micro- or nano-particles of metal or metal alloy powders, thereby affording for the electrical conductivity of the ink and its respective products. Silver is the most common metal used in conductive inks. Most silver inks are made of nano-sized silver particles mixed with solvents and resins. Such inks are widely used in screen printing, as well as other printing techniques. The use of conductive inks based on silver has several drawbacks. Among them are silver migration, ink delamination, dielectric delamination and the high cost of silver powders. One of the possible replacements for silver in conductive inks is copper. Copper is not widely used in the printed electronics field due to its tendency to oxidize easily in ambient environment, and therefore requires the use of expensive equipment and processes to keep it conductive. Moreover, in order to gain conductivity, copper particles should be sintered at temperatures which are not compatible with mainstream polymeric substrates used in PEs.

Sintering of nano-size particles on non-conductive polymeric substrates can be achieved as nano-size particles sinter at considerably lower temperature, but it requires using custom-built and expensive capital equipment, such as photonic pulsing, which significantly increases the total cost of the printing process, has some technical limitations, and is not widely acceptable by the industry. Alternatively, sintering can be achieved by mixing a high melting point (HMP) metal, such as copper, with a low melting point (LMP) metal or alloy, such as a solder alloy, which serves as a binder phase between the HMP powder particles. This approach is commonly known as Liquid Phase Sintering (LPS) or Transient-liquid-phase sintering (TLPS). Depending on the circumstances, the mixed powder can be heated over the melting point of the LMP alloy, or it can be heated to the sintering temperature of the LMP alloy.

In order to suppress the oxidation of copper during the LPS/TLPS sintering, fluxing chemicals are used. U.S. Pat. No. 5,376,403 to Capote et al., discloses electrically conductive adhesive, which comprises, depending upon the intended end use, three or more of the following: a relatively high melting metal powder; solder powder; the active cross-linking agent which also serves as a fluxing agent; a resin; and a reactive monomer or polymer In a later U.S. Pat. No. 5,716,663, directed to methods for fabricating single and multilayer printed boards which employ electronically conductive adhesive compositions, Capote et al., explain that the compositions use a high melting point metal and a relatively low melting point alloy which undergo the TLPS process to form true metallurgical joints between the metal particles. Other US patents, including, inter alia, U.S. Pat. Nos. 5,830,389, 5,853,622, 5,922,397, and 9,005,330 further disclose different aspects of LPS/TLPS for electronics manufacturing.

WO 2000/059645 is directed to methods of fabrication of complex multi-layer circuits by sequential methodology using a TLPS composite as an improved seed layer for electrolytic plating of circuit elements and vias. TLPS composite materials contemplated for use in said invention typically contain an HMP metal or metal alloy powder; an LMP metal or metal alloy powder (solder); optionally, a binder; and optionally, a cross-linking agent comprising a latent or chemically protected curing agent, which also acts as a primary fluxing agent. EP 0793405 is related to electronic assemblies comprising a sinterable composition generally comprising at least one high melting particulate phase material, at least one low melting material, and an organic portion comprising a resin and a cross-linking agent.

Accordingly, the TLPS approach requires customized organic materials for improving the metal adhesion to the PCB substrate and/or for reducing the negative effect of the flux on the physical properties and structure of the conductive traces.

WO 2016/166751 to some of the inventors of the present invention provides an alternative approach to decreasing the porosity and enhancing conductivity of PCB traces obtainable by deposition of solder-based inks. A two-step patterning method involves two different ink compositions, wherein said two compositions are successively applied and individually sintered to form a single conductive path, wherein the application of the second composition serves to fill the pores or voids of the first layer.

There still remains an unmet need for conductive ink compositions for the formation of thin-film conductive elements in printed electronic devices. Said compositions should be cost-efficient and have reasonable shelf life. Conductive elements obtained by printing said compositions should have high electrical conductivity, mechanical stability, and strong adhesion to various substrates.

SUMMARY OF THE INVENTION

The present invention provides an advantageous printable conductive composition and kit, for use in the field of printed electronics and in particular, for the fabrication of conductive traces, lines, wires, pads, and circuits in various printed electronic devices.

The present invention overcomes the problems of instability of ready-to-use compositions by providing two separate components that are stable and are mixed together to form the conductive ink composition prior to use. Thus, the printable conductive compositions provided by the present invention are ready-to-mix compositions, comprising two separate components, i.e., a first metallic component, comprising an HMP metal or metal alloy powder having sub-15 μm particles, and a second fluxing component. Said components are kept separately during production, shipping and storage and should be mixed directly before printing. The present invention is based in part on the unexpected discovery that separating the HMP metal or metal alloy powder from the fluxing component significantly prolongs the shelf life of the printable composition while maintaining its high efficiency and providing reasonable pot life.

In accordance with the principles of the present invention, the mean particle size of the HMP metal or metal alloy powder should be less than about 15 μm in order to obtain sufficiently conductive thin printed traces (e.g., being about 20 μm thick or less). It is now disclosed for the first time that customary fluxes, which are routinely used to decrease the extent of oxidation of copper during soldering, (e.g., rosin-containing organic fluxes), did not efficiently protect the fine metal and metal alloy powders during sintering of the printed composition. The use of such compositions resulted in low conductivity of thin metal traces (i.e., less than about 30 μm thick), which are unsuitable for use in electronic devices.

To overcome these problems, the fluxing component of the two-component compositions of the present invention, also termed herein "activated flux", comprises an organic acid having at least two carboxylic groups, which provides enhanced chemical activity during the printing and sintering processes. The present invention is further based on the unexpected discovery that the use of said organic acid having a plurality of carboxylic groups, in combination with the HMP metal or metal alloy powder having small particles, as a single component conductive ink, resulted in degradation of ink conductivity and significant increase in viscosity, as a function of storage time, even at room temperature. This is particularly surprising in view of the enhanced protection afforded by the use of said organic acid during sintering. Accordingly, it is a prerequisite of the present invention that the highly active organic acid of the printable conductive composition be maintained separately from the HMP metal or metal alloy powder during ink manufacturing and storage.

Additional improvement of the printable composition properties, such as, for example, pot life and stability of the ink after mixing of the two components, was achieved by the addition of stabilizing agents, including, inter alia, sulfur-containing organic compounds and by controlling acidity of the fluxing component.

According to a first aspect of the invention, there is provided a two-component printable conductive composition comprising, as two separate components ready for mixing: a metallic component comprising a high melting point (HMP) metal or metal alloy powder having a mean particle size below about 15 μm; and a fluxing component comprising an organic acid characterized by having at least two carboxylic groups and a first logarithmic acid dissociation constant ($pK_{a1}$) of at most about 4 and an organic solvent, wherein the two components are maintained separately and mixed prior to use.

According to some embodiments, the metallic component, the fluxing component, or both further comprise a stabilizing agent. The stabilizing agent can be selected from the group consisting of a thiol compound, thioamide compound, urea compound, and salts, derivatives, and combinations thereof. In further embodiments, the stabilizing agent is selected from the group consisting of thiourea, octanethiol, dodecanethiol, dimethyl urea, and combinations thereof. Each possibility represents a separate embodiment of the invention. In a certain embodiment, the stabilizing agent comprises $SC(NH_2)_2$. The fluxing component can comprise from about 0.1% (w/w) to about 20% (w/w) of the stabilizing agent out of the total weight of the fluxing component.

According to some embodiments, the organic acid has a molecular weight (Mw) of less than about 230 g/mole. According to further embodiments, the $pK_{a1}$ of the organic acid ranges from about 2 to about 4. According to certain embodiments, the $pK_{a1}$ of the organic acid ranges from about 2.5 to about 3.5.

According to some embodiments, the organic acid having at least two carboxylic groups is selected from the group consisting of citric acid, tartaric acid, malic acid, maleic acid, malonic acid, glutamic acid, phthalic acid, fumaric acid, and isomers and combinations thereof. In further embodiments, the organic acid is selected from citric acid and tartaric acid. Each possibility represents a separate embodiment of the invention. In certain embodiments, the organic acid is citric acid.

The fluxing component can comprise from about 2% (w/w) to about 60% (w/w) of the organic acid out of the total weight of the fluxing component.

According to some embodiments, the organic solvent of the fluxing component is selected from the group consisting of a glycol diether, ester, halogenated aromatic compound, and combinations thereof. According to some embodiments, the glycol diether is selected from the group consisting of propylene glycol dimethyl ether, diethylene glycol dimethyl ether, ethylene glycol dimethyl ether, ethylene glycol diethyl ether, ethylene glycol dipropyl ether, diethylene glycol diethyl ether, triethylene glycol butyl methyl ether, tetraethylene glycol dimethyl ether, dipropylene glycol dimethyl ether, polyethylene glycol dimethyl ether, and combinations thereof. Each possibility represents a separate embodiment of the invention. The fluxing component can comprise from about 0.5% (w/w) to about 60% (w/w) of the organic solvent out of the total weight of the fluxing component.

According to some embodiments, the HMP metal or metal alloy powder comprises at least one metal selected from the group consisting of Cu, Ni, Co, Fe, Mo, Al, Ag, Au, Pt, Pd, Be, and Rh. Each possibility represents a separate embodiment of the invention. In some exemplary embodiments, the HMP metal or metal alloy powder comprises copper (Cu). According to some embodiments, the mean particle size of the HMP metal or metal alloy powder ranges from about 0.1 μm to about 10 μm. The metallic component can comprise from about 30% (w/w) to about 100% (w/w) of the HMP metal or metal alloy out of the total weight of the metallic component.

According to some embodiments, the metallic component, the fluxing component or both further comprise a low melting point (LMP) metal or metal alloy. In some embodiments, the LMP metal or metal alloy powder comprises at least one metal selected from the group consisting of Sn, Bi, Pb, Cd, Zn, Ga, In, Te, Hg, Tl, Sb, Se, and Po. Each possibility represents a separate embodiment of the invention. In some exemplary embodiments, the LMP metal or metal alloy powder comprises a tin (Sn) alloy. In further embodiments, the mean particle size of the LMP metal or metal alloy powder is below about 15 μm. The metallic component can comprise up to about 70% (w/w) of the LMP metal or metal alloy out of the total weight of the metallic component. According to some embodiments, the fluxing component comprises up to about 80% (w/w) of the LMP metal or metal alloy of the total weight of the fluxing component.

According to some embodiments, the metallic component further comprises a fluid dispersion medium, which is inert to the HMP metal or metal alloy. The fluid dispersion medium can be selected from the group consisting of a glycol diether, ester, halogenated aromatic compound, and combinations thereof. According to some embodiments, the glycol diether is selected from the group consisting of propylene glycol dimethyl ether, diethylene glycol dimethyl ether, ethylene glycol dimethyl ether, ethylene glycol diethyl ether, ethylene glycol dipropyl ether, diethylene glycol diethyl ether, triethylene glycol butyl methyl ether, tetraethylene glycol dimethyl ether, dipropylene glycol dimethyl ether, polyethylene glycol dimethyl ether, and combinations thereof. Each possibility represents a separate embodiment of the invention. According to some embodiments, the metallic component comprises up to about 30% (w/w) of the fluid dispersion medium out of the total weight of the metallic component.

According to some embodiments, the metallic component, the fluxing component, or both further comprise at least one additive selected from the group consisting of an adhesion-promoting agent, anti-oxidant agent, and combinations thereof.

According to some embodiments, the adhesion-promoting agent comprises an organic acid having one carboxylic group. According to some embodiments, the organic acid having one carboxylic group is selected from the group consisting of a resin acid, a fatty acid, and combinations or derivatives thereof. Each possibility represents a separate embodiment of the invention. In certain embodiments, the organic acid having one carboxylic group has a molecular weight of at least about 250 g/mole.

According to some embodiments, the anti-oxidant agent comprises a phenol. In further embodiments, the phenol is selected from the group consisting of hydroquinone, butylated hydroxyl toluene, and combinations or derivatives thereof. Each possibility represents a separate embodiment of the invention.

According to some embodiments, the metallic component comprises up to about 40% (w/w) of the at least one additive out of the total weight of the metallic component. According to some embodiments, the fluxing component comprises up to about 30% (w/w) of the at least one additive out of the total weight of the fluxing component.

According to some embodiments, the metallic component comprises no more than about 5% (w/w) of the organic acid having at least two carboxylic groups out of the total weight of the metallic component. According to some embodiments, the metallic component is essentially free of the organic acid having at least two carboxylic groups.

According to some embodiments, the fluxing component has a viscosity ranging from about 100 to about 30,000 cP.

According to certain embodiments, the two-component printable conductive composition comprises: the metallic component comprising: from about 35% (w/w) to about 75% (w/w) copper powder; and from about 25% (w/w) to about 65% (w/w) tin alloy powder, and the fluxing component comprising: from about 5% (w/w) to about 50% (w/w) citric or tartaric acid; from about 1% (w/w) to about 20% (w/w) resin acid; and from about 5% (w/w) to about 60% (w/w) glycol diether.

According to certain embodiments, the two-component printable conductive composition comprises: the metallic component comprising: from about 35% (w/w) to about 75% (w/w) copper powder; and from about 25% (w/w) to about 65% (w/w) tin alloy powder, and the fluxing component comprising: from about 5% (w/w) to about 50% (w/w) citric acid; from about 0.1% (w/w) to about 20% (w/w) thiourea; from about 1% (w/w) to about 20% (w/w) resin acid; and from about 5% (w/w) to about 60% (w/w) glycol diether.

According to certain embodiments, the two-component printable conductive composition comprises: the metallic component comprising: about 100% (w/w) copper powder, and the fluxing component comprising: from about 2% (w/w) to about 30% (w/w) citric acid; from about 50% (w/w) to about 80% (w/w) tin alloy powder; from about 1% (w/w) to about 20% (w/w) resin acid; and from about 3% (w/w) to about 30% (w/w) glycol diether.

According to some embodiments, the two-component printable conductive composition comprises, following mixing of the two separate components, from about 20% (w/w) to about 60% (w/w) copper powder, from about 15% (w/w) to about 55% (w/w) tin alloy powder, from about 5% (w/w) to about 20% (w/w) citric or tartaric acid, from about 5% (w/w) to about 20% (w/w) glycol diether, and from about 1% (w/w) to about 10% (w/w) thiourea.

According to some embodiments, the two-component printable conductive composition comprises, following mixing of the two separate components, from about 20% (w/w) to about 60% (w/w) copper powder, from about 15% (w/w) to about 55% (w/w) tin alloy powder, from about 5% (w/w) to about 20% (w/w) citric or tartaric acid, from about 5% (w/w) to about 20% (w/w) glycol diether, from about 0.5 (w/w) to about 5% (w/w) resin acid; and from about 1% (w/w) to about 10% (w/w) thiourea.

According to another aspect, the present invention provides a kit comprising the composition as presented in various embodiments hereinabove, wherein the metallic component and the fluxing component are disposed in separate containers.

According to some embodiments, the kit further comprises a dosing apparatus configured to provide a predetermined volume of the metallic component and a predetermined volume of the fluxing component.

In some embodiments, the kit further comprises instructions for mixing the metallic component with the fluxing component. In further embodiments, the instructions direct that the weight ratio of the metallic component and the fluxing component range from about 20:1 to about 2:1. In still further embodiments, the instructions direct that the viscosity of the mixture of the metallic component and the fluxing component ranges from about 2,000 cP to about 300,000 cP. In yet further embodiments, the instructions direct that the mixture of the metallic component and the fluxing component is used for printing within less than about 24 hours following the mixing.

According to yet another aspect, the present invention provides a method for deposition and patterning of the two-component conductive composition as presented in various embodiments hereinabove, the method comprising:
 a) mixing the metallic component with the fluxing component; and
 b) applying the mixture obtained in step (a) to an insulating substrate.

According to some embodiments, the weight ratio of the metallic component and the fluxing component in step (a) ranges from about 20:1 to about 2:1. According to some embodiments, the viscosity of the mixture obtained in step (a) ranges from about 2,000 cP to about 300,000 cP. According to further embodiments, the time period between step (a) and step (b) is less than about 24 hours.

According to some embodiments, the method further comprises step (c) comprising heating the applied mixture to a sintering temperature for a period of time sufficient to sinter the conductive composition.

According to yet another aspect, the present invention provides a printed electronic device comprising at least one conductive trace obtained by the method as presented hereinabove. According to some embodiments, the thickness of said conductive trace ranges from about 1 μm to about 30 μm.

It is to be understood that any combination of each of the aspects and the embodiments disclosed herein is explicitly encompassed within the disclosure of the present invention.

Further embodiments and the full scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION

Figure 1:
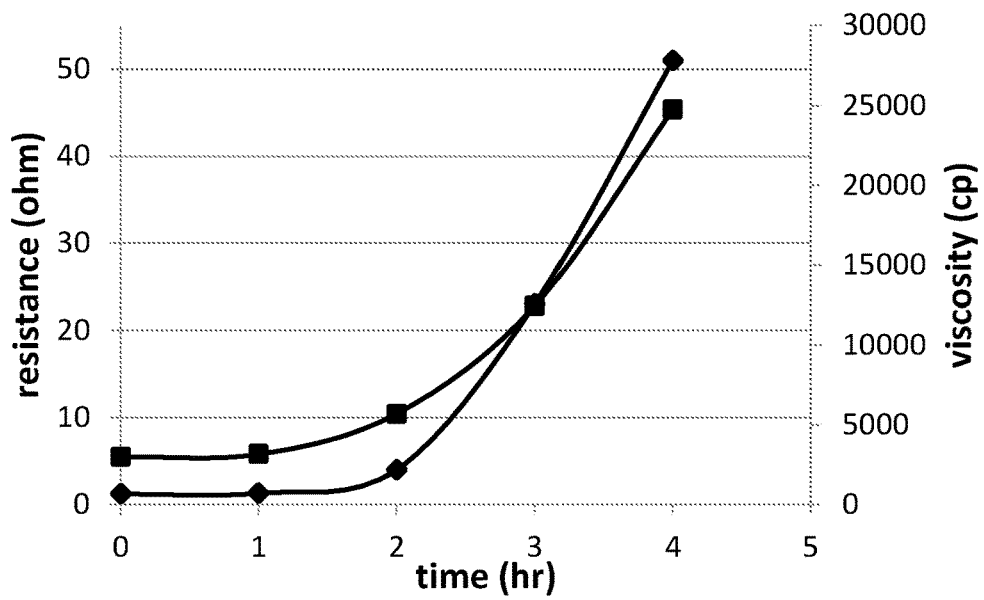
FIG. 1 depicts a graph of viscosity (squares) of a conductive composition comprising activated flux comprising citric acid and resistance (diamonds) of a trace line obtained from said composition as a function of time following mixing of the components of said composition.

The present invention provides an advantageous printable conductive composition, also termed herein "ink", for use in the field of printed electronics and in particular for the fabrication of thin conductive traces, lines, wires, vias, electrodes, pads, and circuits in various printed electronic devices.

The printable conductive compositions of the present invention are ready-to-mix compositions, comprising two separate components, i.e., a metallic component and a fluxing component. Said components are kept separately during production, shipping and storage and should be mixed shortly before printing. The present invention is based in part on a surprising finding that separating the metal component of the printable ink from the fluxing component significantly prolongs the shelf life of the printable composition without compromising its efficiency. Even more so, the two-component printable conductive composition was found to provide the conductivity, adhesion and thickness, which meet the requirements of the current printed electronics technology. In particular, copper-based compositions of the present invention are suitable for forming thin (i.e., in the 1-20 μm range) conductive traces and layers with conductivity, which is comparable to silver-based inks. The present invention therefore provides a cost-efficient, highly active printable conductive composition, which shelf life is more than about 300 times higher than that of a single-component printable ink comprising the same ingredients when held at room temperature.

The metallic component of the two-component composition comprises an HMP metal or metal alloy powder, which can optionally be suspended in an organic solvent and/or mixed with LMP metal or metal alloy powder. In order to meet the thickness standards of the printed electronics technology, the mean particle size of the metal or metal alloy powders of the printable composition should not exceed 15 μm. Without wishing to being bound by theory or mechanism of action, said micron to sub-micron sized powders have high surface energy and are prone to oxidation, even at ambient conditions. It is therefore particularly surprising that keeping such active powders separately from the fluxing component affords for the extended shelf life of the printable composition and enhances the conductivity of the printed composition. As used herein, the term "shelf life" refers to the period of time during which the metallic component and the fluxing component are stored separately and until the mixing of said components.

The inventors of the present invention have discovered that rosin-based fluxes, which are routinely used to decrease the extent of oxidation of copper during soldering, were not sufficiently active in protecting the micron-sized HMP metal and metal alloy powders during sintering of the printed composition, which resulted in low conductivity of metal traces being unsuitable for use in electronic devices. The fluxing component of the two-component compositions of the present invention therefore employs an organic acid having at least two carboxylic groups, which is characterized by enhanced activity during printing and sintering of the metallic powders. Surprisingly, the use of said organic acid in combination with the micron-sized HMP metal or metal alloy powder, as a single component conductive ink, resulted in degradation of ink conductivity as a function of storage time.

According to a first aspect of the invention, there is provided a two-component printable conductive composition comprising, as separate components:
(a) a metallic component comprising a high melting point (HMP) metal or metal alloy powder having a mean particle size below about 15 µm; and
(b) a fluxing component comprising an organic acid having at least two carboxylic groups and an organic solvent.

The term "two-component composition" as used herein refers to a product comprising at least two compositions, which are kept apart prior to use, and which are to be mixed in order to provide a ready-to-use printable ink. In some embodiments, the two-component composition comprises two components, i.e., the metallic component and the fluxing component. In additional embodiments, the two-component composition comprises three components. For example, the two-component composition can include a first metallic component, a fluxing component and a second metallic component, comprising a different metal or metal alloy (e.g., an LMP metal alloy). Alternatively, the two-component composition can include a metallic component, a first fluxing component, and a second fluxing component.

The term "conductive" as used herein in the context of the two-component printable composition refers to the conductivity of the printed conductive trace prepared from said composition following deposition and high temperature processing of the composition. In further embodiments, the term "conductive" refers to the conductive trace prepared from said composition, which has resistance below about 100 mOhm/sq per trace thickness of 1 mil (or about 25 µm). The term "conductive traces", as used herein, is to be understood to include any conductive flow path on an electronic device, such as, but not limited to, conductive pads, conductive lines, conductive terminals, conductive layers, connectors, vias and the like.

The term "high melting point (HMP) metal" as used herein, refers in some embodiments, to a metal having a melting point of above about 650° C. In further embodiments, the term "high melting point (HMP) metal" refers to a metal having a melting point of about 900° C. or higher. In further embodiments, the term "HMP metal" refers to a metal having a melting point of about 1000° C. or higher. The term "HMP metal alloy", as used herein, refers in some embodiments, to an alloy or intermetallic compound comprising at least about 80% (w/w) of the foregoing HMP metal. In further embodiments, the term "HMP metal alloy" refers to an alloy or intermetallic compound consisting essentially of the foregoing HMP metals.

According to some embodiments, the HMP metal or metal alloy powder comprises at least one metal selected from Cu, Ni, Co, Fe, Mo, Al, Ag, Au, Pt, Pd, Be, and Rh. In some exemplary embodiments, the HMP metal or metal alloy powder comprises Cu (copper) or Cu alloy.

In some embodiments, the HMP metal or metal alloy powder comprises high purity Cu, having a copper weight content of over about 99.5%. In further embodiments, the HMP metal or metal alloy powder comprises high purity Cu, comprising a copper weight content of over about 99.6%, over about 99.8%, or over about 99.95%.

According to some embodiments, the HMP metal or metal alloy powder is in the form of particulate matter comprising particles. In some embodiments, the HMP metal alloy powder comprises particles having a substantially spherical shape. In other embodiments, the HMP metal alloy powder comprises particles being flake or platelet shaped. In additional embodiments, the HMP metal alloy powder comprises particles having a dendritic or spongiform shape.

The metal or metal alloy powders suitable for use in the two-component composition of the present invention can include monodisperse or polydisperse particles.

The term "particle size", as used in various embodiments of the invention, refers to the length of the particle in the longest dimension thereof if the particle is not spherical. If the particle is essentially spherical, the term "particle size" refers to the particle diameter. Accordingly, in certain such embodiments, the terms "particle size" and "particle diameter" are used interchangeably.

The term "mean particle size" can refer to the size of monodisperse particles or polydisperse particles. The term "mean particle size", as used herein, refers in some embodiments, to an equivalent spherical diameter as determined by laser light diffraction scattering (or dynamic light scattering). In some embodiments, the term "mean particle size" refers to an arithmetic average of particle sizes as measured by conventional particle size measuring techniques well known to those skilled in the art, such as sedimentation field flow fractionation, photon correlation spectroscopy, or disk centrifugation. In certain such embodiments, the term "mean particle size below about 15 µm" means that when averaging at least about 80% of the particle sizes measured by the above-mentioned techniques, the arithmetic average particle size is less than about 15 µm. In additional embodiments, the term "mean particle size" is calculated by sieving a sample of the powder into a number of fractions (typically 5 fractions) on a series of Tyler sieves. The weight fractions thereby obtained are plotted against the aperture size of the sieves. The mean particle size is taken to be the aperture size through which 50% by weight of the powder would pass.

In certain embodiments, the mean particle size of the HMP metal or metal alloy powder is less than about 10 µm. In certain embodiments, the mean particle size of the HMP metal or metal alloy powder is less than about 5 µm.

In some embodiments, the mean particle size of the HMP metal or metal alloy powder ranges from about 0.1 µm to about 15 µm. In further embodiments, the mean particle size ranges from about 0.1 µm to about 10 µm. In still further embodiments, the mean particle size of the HMP metal or metal alloy powder ranges from about 0.5 µm to about 10 µm. In yet further embodiments, the mean particle size of the HMP metal or metal alloy powder ranges from about 0.5 µm to about 5 µm. In still further embodiments, the mean particle size of the HMP metal or metal alloy powder ranges from about 1 µm to about 5 µm. In additional embodiments, the mean particle size of the HMP metal or metal alloy powder ranges from about 0.1 µm to about 5 µm. In some additional embodiments, the mean particle size is in the range of about 0.1 µm to about 1 µm, or about 1 µm to about 10 µm. Each possibility represents a separate embodiment of the invention.

In certain embodiments, the HMP metal or metal alloy powder comprises copper having a mean particle size ranging from about 0.1 µm to about 10 µm.

According to some embodiments, the surface area of the HMP metal or metal alloy powder ranges from about 0.1 to about 50 $m^2/g$. According to further embodiments, the surface area of the HMP metal or metal alloy powder ranges from about 0.5 to about 25 $m^2/g$. According to still further embodiments, the surface area of the HMP metal or metal alloy powder ranges from about 1 to about 10 $m^2/g$.

According to some embodiments, the metallic component comprises from about 30% (w/w) to about 100% (w/w) of the HMP metal or metal alloy out of the total weight of the metallic component. According to some embodiments, the metallic component comprises from about 30% to about 40% (w/w), or about 40% to about 50% (w/w), or about 50% to about 60% (w/w), or about 60% to about 70% (w/w), or about 70% to about 90% (w/w) of the HMP metal or metal alloy out of the total weight of the metallic component. Each possibility represents a separate embodiment of the invention.

In some embodiments, the metallic component comprises from about 40% (w/w) to about 90% (w/w) of the HMP metal or metal alloy out of the total weight of the metallic component. In further embodiments, the metallic component comprises from about 40% (w/w) to about 80% (w/w) of the HMP metal or metal alloy out of the total weight of the metallic component. In still further embodiments, the metallic component comprises from about 40% (w/w) to about 70% (w/w) out of the HMP metal or metal alloy of the total weight of the metallic component. In yet further embodiments, the metallic component comprises from about 40% (w/w) to about 60% (w/w) of the HMP metal or metal alloy out of the total weight of the metallic component. In some exemplary embodiments, the metallic component comprises about 50% (w/w) HMP metal or metal alloy out of the total weight of the metallic component. In further embodiments, said HMP metal or metal alloy comprises copper.

In some embodiments, the metallic component comprises from about 40% (w/w) to about 100% (w/w) of the HMP metal or metal alloy out of the total weight of the metallic component. In further embodiments, the metallic component comprises from about 50% (w/w) to about 100% (w/w) of the HMP metal or metal alloy out of the total weight of the metallic component. In still further embodiments, the metallic component comprises from about 60% (w/w) to about 100% (w/w) of the HMP metal or metal alloy out of the total weight of the metallic component. In yet further embodiments, the metallic component comprises from about 70% (w/w) to about 100% (w/w) of the HMP metal or metal alloy out of the total weight of the metallic component. In still further embodiments, the metallic component comprises from about 80% (w/w) to about 100% (w/w) of the HMP metal or metal alloy out of the total weight of the metallic component. According to further embodiments, the metallic component comprises from about 90% to about 100% (w/w) of the HMP metal or metal alloy out of the total weight of the metallic component. In some exemplary embodiments, the metallic component comprises about 100% (w/w) of the HMP metal.

According to some embodiments, the metallic component further comprises a low melting point (LMP) metal or metal alloy. The term "low melting point (LMP) metal" as used herein, refers in some embodiments, to a metal having a melting point of below about 400° C. In further embodiments, the term "LMP metal" refers to a metal having a melting point of about 250° C. or lower. The term "LMP metal alloy", as used herein, refers in some embodiments, to an alloy or intermetallic compound of eutectic or non-eutectic composition. The term "eutectic alloy", as used herein, refers in some embodiments to an alloy which melts or solidifies at a single temperature. In further embodiments, the term "LPM metal alloy" refers to an alloy or intermetallic compound consisting essentially of the foregoing LMP metals.

Without wishing to being bound by theory or mechanism of action, it is contemplated that the LMP metal or metal alloy is used as a solder alloy, which serves as a binder phase between the HMP powder particles. The mixed powder can be heated over the melting point of the LMP alloy, or it can be heated to the sintering temperature of the LMP alloy. According to some embodiments, the LMP metal or metal alloy powder comprises at least one metal selected from Sn, Bi, Pb, Cd, Zn, Ga, In, Te, Hg, Tl, Sb, Se, and Po. In some exemplary embodiment, the LMP metal or metal alloy powder comprises Sn (tin) or tin alloy. In some embodiments, the LMP metal or metal alloy powder comprises Sn (tin) and/or Bi (bismuth). In further embodiments, the LMP metal alloy comprises a tin-bismuth (Sn/Bi) alloy. In further embodiments, the LMP metal alloy comprises a tin-bismuth-silver (Sn/Bi/Ag) alloy.

According to some embodiments, the LMP metal or metal alloy powder is in the form of particulate matter comprising particles. In some embodiments, the LMP metal alloy powder comprises particles having a substantially spherical shape. In other embodiments, the LMP metal alloy powder comprises particles being flake or platelet shaped. In additional embodiments, the LMP metal alloy powder comprises particles having a dendritic or spongiform shape.

In some embodiments, the mean particle size of the LMP metal or metal alloy powder ranges from about 0.1 µm to about 15 µm. In further embodiments, the mean particle size ranges from about 0.1 µm to about 10 µm. In still further embodiments, the mean particle size of the LMP metal or metal alloy powder ranges from about 0.5 µm to about 10 µm. In yet further embodiments, the mean particle size of the LMP metal or metal alloy powder ranges from about 0.5 µm to about 5 µm. In still further embodiments, the mean particle size of the LMP metal or metal alloy powder ranges from about 1 µm to about 5 µm. In additional embodiments, the mean particle size of the LMP metal or metal alloy powder ranges from about 0.1 µm to about 5 µm. In some additional embodiments, the mean particle size is in the ranges of about 0.1 µm to about 1 µm, or about 1 µm to about 10 µm. Each possibility represents a separate embodiment of the invention.

In certain embodiments, the LMP metal or metal alloy powder comprises Sn or Sn alloy having a mean particle size which ranges from about 0.5 µm to about 10 µm.

According to some embodiments, the surface area of the LMP metal or metal alloy powder ranges from about 0.1 to about 50 m$^2$/g. According to further embodiments, the surface area of the LMP metal or metal alloy powder ranges from about 0.5 to about 25 m$^2$/g. According to still further embodiments, the surface area of the LMP metal or metal alloy powder ranges from about 1 to about 10 m$^2$/g.

According to some embodiments, the metallic component comprises from about 0% (w/w) to about 70% (w/w) of the LMP metal or metal alloy out of the total weight of the metallic component. According to some embodiments, the metallic component comprises from about 10% (w/w) to about 50% (w/w) of the LMP metal or metal alloy. According to some embodiments, the metallic component comprises from about 20% (w/w) to about 50% (w/w) of the LMP metal or metal alloy. According to some embodiments, the metallic component comprises LMP metal or metal alloy powder in the range selected from about 30% (w/w) to about 50% (w/w). In some exemplary embodiments, the metallic component comprises about 40% (w/w) LMP metal or metal alloy. According to some embodiments, the metallic component comprises LMP metal or metal alloy powder ranging from about 1% (w/w) to about 15% (w/w), or about 15% (w/w) to about 35% (w/w), or about 35% (w/w) to about 50% (w/w). Each possibility represents a separate embodiment of the invention. In further embodiments, said LMP metal or metal alloy comprises tin, tin alloy or tin-bismuth alloy.

In some embodiments, where the metallic component comprises the LMP metal or metal alloy, the weight ratio between the HMP metal or metal alloy and the LMP metal or metal alloy ranges from about 5:1 to about 1:5. In further embodiments, the weight ratio between the HMP metal or metal alloy and the LMP metal or metal alloy ranges from about 4:1 to about 1:4. In still further embodiments, the weight ratio between the HMP metal or metal alloy and the LMP metal or metal alloy ranges from about 3:1 to about 1:3. In yet further embodiments, the weight ratio between the HMP metal or metal alloy and the LMP metal or metal alloy ranges from about 2:1 to about 1:2. In some embodiments, the weight ratio between the HMP metal or metal alloy and the LMP metal or metal alloy is about 1:1.

Alternatively, the LMP metal or metal alloy powder can be provided as a separate component, for example, as an additional metallic component or as described in WO 2016/166751, incorporated herein by reference in its entirety.

According to some embodiments, the metallic component further comprises a fluid dispersion medium, which is inert to the HMP metal or metal alloy powder. The term "inert" as used herein, refers to a solvent, which does not participate in a redox reaction with the HMP metal or metal alloy powder. In some embodiments, the fluid dispersion medium is further inert to the LMP metal or metal alloy powder. The fluid dispersion mediums can be selected from a polar solvent, a non-polar solvent, an aromatic solvent, a halogenated solvent, or combinations thereof. Each possibility represents a separate embodiment of the invention. In some embodiments, the fluid dispersion medium comprises an organic solvent which is water soluble.

In some embodiments, the fluid dispersion medium comprises a glycol diether. In some related embodiments, the glycol diether is selected from diethylene glycol dimethyl ether, ethylene glycol dimethyl ether, ethylene glycol diethyl ether, ethylene glycol dipropyl ether, diethylene glycol diethyl ether, triethylene glycol butyl methyl ether, tetraethylene glycol dimethyl ether, propylene glycol dimethyl ether, dipropylene glycol dimethyl ether, and polyethylene glycol dimethyl ether. Each possibility represents a separate embodiment of the invention.

According to some embodiments, the metallic component comprises from about 0% (w/w) to about 30% (w/w) of the fluid dispersion medium out of the total weight of the metallic component. In further embodiments, the metallic component comprises from about 1% (w/w) to about 25% (w/w), or about 1% (w/w) to about 20% (w/w), or about 1% (w/w) to about 15% (w/w) of the fluid dispersion medium. Each possibility represents a separate embodiment of the invention. According to some exemplary embodiments, the metallic component comprises about 10% (w/w) of the fluid dispersion medium.

According to some embodiments, the metallic component does not include the fluid dispersion medium. According to some embodiments, the metallic component comprises the HMP metal or metal alloy powder comprising copper having a mean particle size which ranges from about 0.5 µm to about 5 µm; and the LMP metal or metal alloy powder comprising SnBi alloy having a mean particle size which ranges from about 0.5 µm to about 5 µm. In some embodiments, the metallic component comprises HMP metal or metal alloy powder comprising copper having a mean particle size which ranges from about 0.5 µm to about 5 µm.

According to some embodiments, the metallic component further comprises at least one stabilizing agent. According to some embodiments, the stabilizing agent can act as a surfactant. The term "surfactant" as used herein, refers in some embodiments to a molecule or a combination of molecules which interact with the HMP metal or metal alloy powder, the LMP metal or metal alloy powder or both. Said interaction can occur prior to or following the mixing of the two-component printable conductive composition. Non-limiting examples of suitable stabilizing agents include a thiol, thioamide, urea, silane, alkane phosphonic acid, and amine compounds, and salts, combinations and derivatives thereof.

In some embodiments, the stabilizing agent comprises a thiol compound. The term "thiol compound", as used herein, refers to an organic compound having a —SH group. According to some embodiments, the thiol is selected from alkylthiols, arylthiols, alkylarylthiols, alkenyl thiols, alkynyl thiols, cycloalkyl thiols, heterocyclyl thiols, heteroaryl thiols, alkylthiolates, alkenyl thiolates, alkynyl thiolates, cycloalkyl thiolates, heterocyclyl thiolates, heteroaryl thiolates, ω-functionalized alkanethiolates, arenethiolates, (γ-mercaptopropyl)tri-methyloxysilane, dialkyl disulfides, thioesters (such as methyl mercaptoacetate), or combinations thereof. Each possibility represents a separate embodiment of the present invention.

In certain embodiments, the thiol compound is alkyl thiol. An "alkyl" group refers to a saturated aliphatic hydrocarbon, including straight-chain, branched-chain and cyclic alkyl groups. In one embodiment, the alkyl group has 6-16 carbons designated here as $C_6$-$C_{16}$-alkyl. In a further embodiment, the alkyl group has 8-12 carbons designated here as $C_8$-$C_{12}$-alkyl. The alkyl group may be unsubstituted or substituted by one or more groups selected from alcohol, ketone, aldehyde, halogen, carbonate, carboxylate, carboxylic acid, acyl, amido, amide, amine, imine, ester, ether, cyano, nitro, silane, azido, phosphate, phosphinate, phosphonate, phosphonium, phosphorothioate, phosphoryl, sulfamoyl, sulfate, sulfinic acid, sulfonamido, sulfonate, sulfonic acid, sulfonyl, sulfoxide, thiol, thioureido, and ureido. Non-limiting examples of a suitable alkylthiol include octanethiol and dodecanethiol. Each possibility represents a separate embodiment of the present invention.

In some embodiments, the thiol compound is arylthiol. An "aryl" group refers to an aromatic monocyclic or multicyclic ring system. In one embodiment, the aryl group has 6-10 carbon atoms. The aryl is optionally substituted with at least one "ring system substituents" and combinations thereof as defined herein. Exemplary aryl groups include phenyl or naphthyl. An alkylaryl is an alkyl group as defined herein bonded to an aryl group as defined herein. The aryl group can be unsubstituted or substituted through available carbon atoms with one or more groups defined hereinabove for alkyl. One non-limiting example of a suitable arylthiol includes benzene thiol.

In some embodiments, the thiol compound is heteroarylthiol. A "heteroaryl" group refers to a heteroaromatic system containing at least one heteroatom ring wherein the atom is selected from nitrogen, sulfur and oxygen. The heteroaryl contains 5 or more ring atoms. The heteroaryl group can be monocyclic, bicyclic, tricyclic and the like. Also included in this definition are the benzoheterocyclic rings. The heteroaryl group can be unsubstituted or substituted through available atoms with one or more groups defined hereinabove for alkyl. One non-limiting example of a suitable heteroarylthiol is 2-mercaptobenzothiazole (MBT).

In some embodiments, the stabilizing agent comprises a thioamide compound. The term "thioamide compound", as used herein, refers to an organic compound having a —C(=S)—NR'R"— group, wherein each of R' and R" is independently selected from the group consisting of H, alkyl, alkenyl, alkynyl, cycloalkyl, cycloalkenyl, cycloalkynyl, aryl, heteroaryl, and heterocyclyl. In certain embodiments, thioamides correspond to amides (or oxiamides) wherein the carbonyl group of the amide bond is replaced with a thiocarbonyl group.

In some embodiments, thioamide compound comprises a thiourea. The term "thiourea", as used herein, refers to an organic compound having the formula —$NR^1R^2$—C(=S)—$NR^3R^4$ group, wherein each of $R^1$, $R^2$, $R^3$, and $R^4$ is independently selected from the group consisting of H, alkyl, alkenyl, alkynyl, cycloalkyl, cycloalkenyl, cycloalkynyl, aryl, heteroaryl, and heterocyclyl. In some embodiments, each of $R^1$, $R^2$, $R^3$, and $R^4$ is H. In some exemplary embodiments, the surfactant comprises $SC(NH_2)_2$.

In some embodiments, the stabilizing agent comprises an urea compound. The term "urea compound", as used herein, refers to an organic compound having the formula —$NR^1R^2$—C(=O)—$NR^3R^4$ group, wherein each of $R^1$, $R^2$, $R^3$, and $R^4$ is independently selected from the group consisting of H, alkyl, alkenyl, alkynyl, cycloalkyl, cycloalkenyl, cycloalkynyl, aryl, heteroaryl, and heterocyclyl. In some embodiments, the urea compound is selected from the group consisting of dimethyl urea, allyl urea, methyl urea, ethyl urea, butyl urea, benzyl urea, phenyl urea, 1,3-dipropyl urea, 1,3-dioctadecyl urea, and combinations, derivatives and isomers thereof. In certain embodiments, the urea compound is dimethyl urea. In further embodiments, said dimethyl urea is 1,3-dimethyl urea, In some embodiments, the stabilizing agent comprises a silane compound. The term "silane compound", as used herein, refers to an organic silane compound having the formula R—$SiX_3$, wherein R represents a long chain alkyl or fluorinated alkyl group having 10 or more carbon atoms, especially a $C_{10}$-$C_{20}$ alkyl or fluorinated alkyl group. In some embodiments, the alkyl group is branched and includes at least one methyl group or further includes another element or group beside carbon, hydrogen and fluorine atoms. X denotes a halogen atom or an alkoxy group, for example a $C_1$-$C_3$ alkoxy group. In some embodiments, X is an alkoxy group having half a length of the length of R or less. Non-limiting example of a suitable silane surfactant includes perfluorodecyl dimethyl chlorosilane.

In some embodiments, the stabilizing agent comprises an alkane phosphonic acid. In some embodiments, the surfactant comprises linear alkyl phosphonic acids and/or their phosphonate salts. The term "phosphonic acid" refers to a bifunctional chemical structure, $RP(O)(OH)_2$, consisting of both non-polar organic hydrophobic groups and anionic inorganic hydrophilic groups. In some embodiment, R is a hydrocarbon chain comprising 6-18 carbons. The non-limiting examples of such surfactants include decylphosphonic acid, dodecylphosphonic acid, hexylphosphonic acid, or octadecylphosphonic acid. In other embodiments, R comprises a hydrocarbon chain and at least one additional alkane phosphonic acid group, such as but not limited to, 1,10-decanediylbis(phosphonic acid).

In some embodiments, the stabilizing agent comprises an amine compound. The term "amine compound" can refer to a primary, a secondary, a tertiary, or a cyclic amine. In some embodiments, the amine comprises an amine group connected to a hydrocarbon chain comprising 4-28 carbons. In some embodiments, the amine comprises at least one aryl group. The non-limiting examples of amine surfactants include arginine, 3-methyl-5-octadecylsulfonyl, [1,2,4] triazole-4-ylamine, dimethyl alkyl amine, bis(2-hydroxyethyl) alkyl amine, or lauryldimethylamine oxide (LDAO). In other embodiments, the amine group is a quaternary ammonium cation, and has the chemical structure of $NR^+_4$, wherein R is an alkyl group or an aryl group, and the compound further comprises its compatible quaternary ammonium salt. Non-limiting examples of quaternary ammonium groups are benzethonium chloride, cetylpyridinium chloride (CPC) or dimethyl dioctadecylammonium chloride.

According to some embodiments, the stabilizing agent is selected from the group consisting of thiourea ($SC(NH_2)_2$), dimethyl urea, dodecanethiol, and octanethiol. In certain embodiments, the stabilizing agent is thiourea.

According to some embodiments, the metallic component comprises from about 0% (w/w) to about 20% (w/w) of the stabilizing agent out of the total weight of the metallic component. According to further embodiments, the metallic component comprises from about 0.1% (w/w) to about 20% (w/w) of the stabilizing agent out of the total weight of the metallic component. According to still further embodiments, the metallic component comprises from about 1% (w/w) to about 10% (w/w) of the stabilizing agent out of the total weight of the metallic component.

According to a certain embodiment, the metallic component comprises from about 1% (w/w) to about 10% (w/w) of thiourea out of the total weight of the metallic component. According to a further certain embodiment, the metallic component comprises from about 1% (w/w) to about 10% (w/w) of dodecanethiol out of the total weight of the metallic component. According to an additional embodiment, the metallic component comprises from about 1% (w/w) to about 10% (w/w) of octanethiol out of the total weight of the metallic component.

In some embodiments, the metallic component is essentially free of the stabilizing agent.

According to some embodiments, the metallic component further comprises at least one additive selected from an adhesion-promoting agent, anti-oxidant agent, and combinations thereof. According to some embodiments, the metallic component comprises from about 0% (w/w) to about 10% (w/w) of the additive out of the total weight of the metallic component. According to further embodiments, the metallic component comprises from about 0.05% (w/w) to about 5% (w/w) of the additive out of the total weight of the metallic component. According to still further embodiments, the metallic component comprises from about 0.1% (w/w) to about 20% (w/w) of the additive out of the total weight of the metallic component.

One non-limiting example of a suitable adhesion-promoting agent includes an organic acid having one carboxylic group. According to some embodiments, the organic acid having one carboxylic group has molecular weight of at least about 200 g/mole. According to further embodiments, the organic acid having one carboxylic group has molecular weight of at least about 250 g/mole. According to some embodiments, the organic acid having one carboxylic group has a logarithmic acid dissociation constant (pKa) of above about 5. In further embodiments, the organic acid having one carboxylic group has pKa of above about 6. The term logarithmic acid dissociation constant, as used herein, refers to a logarithm of an equilibrium constant of a reaction of the compound in which the compound loses a proton to water, at a temperature of about 20-25° C.

The organic acid having one carboxylic group can be selected from a resin acid, a fatty acid and combinations or derivatives thereof. In certain embodiments, the organic acid having one carboxylic group is a carboxylic acid comprising an aliphatic hydrocarbon chain, which is either saturated or unsaturated. In some embodiments, the hydrocarbon chain has about 10-30 carbons. In some embodiments, said organic acid is a fatty acid. Non-limiting examples of suitable fatty acids include lauric acid, stearic acid, oleic acid, myristic acid, and linoleic acid.

In some embodiments, said organic acid is a resin acid. The terms "resin" or "rosin" as used herein, refer to organic compounds having carboxylic acids, derived from natural sources, such as tree resins. Non-limiting examples of suitable resin acids include abietic acid, pimaric acid, isopimaric acid, neoabietic acid, dihydroabietic acid, and dehydroabietic acid.

One non-limiting example of a suitable anti-oxidant agent is a phenol. Phenol can be selected from hydroquinone, butylated hydroxyl toluene, catechol, 2,6-di-tert-butyl-p-cresol, butyl hydroxyanisol, 2,2'-methylene bis(4-methyl-6-tert-butylphenol), and combinations thereof. In some exemplary embodiment, the anti-oxidant agent is hydroquinone.

In some embodiments, the metallic component is essentially free of the fatty acid. In further embodiments, the metallic component is essentially free of the adhesion-promoting agent.

The terms "substantially free", "substantially devoid", "essentially devoid", "devoid", "does not include" and "does not comprise" may be used interchangeably and refer to a composition that comprises less than 0.1 mol %, less than 0.01 mol %, or less than 0.001 mol % of a particular compound. In further embodiments, the term "substantially free" refers to an amount of the particular compound which is undetectable by conventional analytical techniques.

In further embodiments, the metallic component is essentially free of any additive listed hereinabove.

According to some embodiments, the metallic component comprises no more than about 5% (w/w) of the organic acid having at least two carboxylic groups. According to further embodiments, the metallic component comprises no more than about 2% (w/w) of said organic acid. According to still further embodiments, the metallic component comprises no more than about 0.5% (w/w) or no more than about 0.01% (w/w) of said organic acid. According to some currently preferred embodiments, the metallic component is essentially free of the organic acid having at least two carboxylic groups.

According to some embodiments, the metallic component as presented hereinabove, is in a form of a metal dispersion, wherein the HMP metal or metal alloy and, optionally, the LMP metal or metal alloy are dispersed in the fluid dispersion medium. The term "dispersion", as used herein, is meant to encompass suspensions. In certain embodiments, said dispersion is essentially homogeneous. The terms "homogeneous" and "uniform" which can be used interchangeably, refer, in some embodiments, to a dispersion wherein the weight percentage of the particles of metal or metal alloy powder varies between two different portions by less than about 95%, less than about 85% or less than about 75%. Each possibility represents a separate embodiment of the invention.

According to some embodiments, the dispersion has a viscosity ranging from about 500 to about 10000 cP. According to some embodiments, said dispersion has a viscosity ranging from about 5000 to about 50000 cP. In further embodiments, the dispersion has a viscosity ranging from about 50000 to about 400000 cP. The viscosity values presented in various embodiments of the invention refer to viscosity measured by Brookfield viscometer at shear rates of 10-150 (1/sec) and a temperature of 25° C.

According to some embodiments, the metallic component as presented hereinabove, is not in a form of a metal dispersion. In further such embodiments, the metallic component comprising HMP metal or metal alloy and, optionally LMP metal or metal alloy, is in the form of a particulate matter comprising particles.

As described hereinabove, the two-component printable conductive composition of the present invention comprises a fluxing component, as a second component of the printable composition. The fluxing component comprises an organic acid having at least two carboxylic groups, and an organic solvent.

The term "organic acid having at least two carboxylic groups", as used herein, refers, in some embodiments, to an organic compound having acidic properties, based on the acidity associated with the presence of at least two carboxyl groups (—COOH). According to some embodiments, the organic acid having at least two carboxylic groups has a molecular weight (Mw) of less than about 230 g/mole. In further embodiments, the organic acid having at least two carboxylic groups has Mw of less than about 200 g/mole. In some embodiments, said organic acid has three carboxylic groups.

Non-limiting examples of such organic acids having at least two carboxylic groups include citric acid, tartaric acid, malic acid, maleic acid, malonic acid, glutamic acid, glutaric acid, phthalic acid, isophthalic acid, terephthalic acid, oxalic acid, fumaric acid, adipic acid, succinic acid, and salts, derivatives, isomers and combinations thereof. The term "isomer" is used herein in its broadest sense and includes structural, geometric and stereo isomers.

Without wishing to being bound by theory or mechanism of action, it is contemplated that the organic acid having at least two carboxylic groups can act as a non-toxic, non-corrosive reducing agent, which reduces or eliminates oxidation of the HMP metal or metal alloy and/or the LMP metal or metal alloy during sintering of the two-component composition. It was discovered that organic acids having only one carboxylic group did not efficiently protect the HMP metal from oxidation. It is therefore contemplated that the high activity of the present fluxing component stems from the presence of the two or more carboxylic groups in the organic acid. It has further been found that such organic acids which have low acidity (i.e., $pK_a$ of above about 4) were less efficient in protecting the HMP metal during sintering. Accordingly, in some currently preferred embodiments, the organic acid having at least two carboxylic groups has a first logarithmic acid dissociation constant ($pK_{a1}$) of at most about 4.

It has further been discovered that highly acidic compounds (i.e., having a first $pK_a$ of below about 2), can react with the HMP metal particles immediately after mixing of the two components of the present composition, forming metal complexes and/or salts, thereby significantly affecting pot life, and, in particular, increasing viscosity of the mixed two-component composition and reducing conductivity of the printed trace lines. As used herein, the term "pot life" refers to the period of time following the mixing of the metallic component with the fluxing component and prior to the printing of the mixture. During said period of time the mixture should maintain its properties and be suitable for application.

Acidity of the fluxing component, and in particular, the acidity constants of the organic acids can therefore be controlled, in order to increase pot life of the two-component composition. Accordingly, in some currently preferred embodiments, the organic acid having at least two carboxylic groups has a $pK_{a1}$ which ranges from about 2 to about 4. According to further embodiments, the organic acid has a $pK_{a1}$ ranging from about 2.5 to about 3.5.

According to some embodiments, the organic acid has solubility in the organic solvent of at least about 50% (w/w). In further embodiments, the solubility of the organic acid is at least about 60% (w/w). In additional embodiments, the solubility is at least about 70% (w/w).

In some currently preferred embodiments, the organic acid is selected from citric acid, tartaric acid, malic acid, malonic acid, fumaric acid, phthalic acid, terephthalic acid, and combinations thereof. In further embodiments, the organic acid is selected from citric acid, tartaric acid, and combinations thereof. In still further embodiments, the organic acid is citric acid. In additional embodiments, said acid is tartaric acid.

According to some embodiments, the fluxing component comprises from about 2% (w/w) to about 98% (w/w) of the organic acid out of the total weight of the fluxing component. According to further embodiments, the fluxing component comprises from about 2% (w/w) to about 60% (w/w) of the organic acid. In additional embodiments, the fluxing component comprises from about 5% (w/w) to about 98% (w/w). In further embodiments, the fluxing component comprises from about 5% (w/w) to about 70% (w/w) of the organic acid. In still further embodiments, the fluxing component comprises from about 5% (w/w) to about 50% (w/w) of the organic acid. In certain embodiments, said organic acid is citric acid. In additional embodiments, said acid is tartaric acid.

The organic solvent suitable for use in the fluxing component can be selected from a polar solvent, a non-polar solvent, an aromatic solvent, a halogenated solvent, or combinations thereof. In some embodiments, the organic solvent is water soluble.

According to some embodiments, the first organic solvent is selected from glycol diethers, esters, halogenated aromatic compounds, and combinations thereof. According to some embodiments, the glycol diether is selected from diethylene glycol dimethyl ether, ethylene glycol dimethyl ether, ethylene glycol diethyl ether, ethylene glycol dipropyl ether, diethylene glycol diethyl ether, triethylene glycol butyl methyl ether, tetraethylene glycol dimethyl ether, propylene glycol dimethyl ether, dipropylene glycol dimethyl ether, and polyethylene glycol dimethyl ether. Each possibility represents a separate embodiment of the invention.

According to some embodiments, the organic solvent is identical to the fluid dispersion medium. According to some embodiments, the organic solvent is different from the fluid dispersion medium.

According to some embodiments, the fluxing component comprises the organic solvent in a weight percent ranging from about 0.5% (w/w) to about 70% (w/w) of the total weight of the fluxing component. According to some embodiments, the fluxing component comprises the organic solvent in a weight percent ranging from about 0.5% (w/w) to about 60% (w/w) of the total weight of the fluxing component. According to some embodiments, the fluxing component comprises the organic solvent in a weight percent ranging from about 0.5% (w/w) to about 50% (w/w) of the total weight of the fluxing component. In some embodiments, the fluxing component comprises the organic solvent in an amount ranging from about 1% (w/w) to about 20% (w/w), or about 5% (w/w) to about 30% (w/w), or about 10% (w/w) to about 40% (w/w). In further embodiments, the fluxing component comprises the organic solvent in an amount ranging from about 10% (w/w) to about 20% (w/w), or about 35% (w/w) to about 60% (w/w). Each possibility represents a separate embodiment of the invention. In some embodiments, the fluxing component comprises the organic solvent in an amount ranging from about 5% (w/w) to about 25% (w/w). In some embodiments, the fluxing component comprises the organic solvent in an amount ranging from about 5% (w/w) to about 15% (w/w). In some embodiments, the fluxing component comprises the organic solvent in an amount ranging from about 35% (w/w) to about 60% (w/w). In some embodiments, the fluxing component comprises about 50% (w/w) of the organic solvent.

According to some embodiments, the fluxing component comprises a low melting point (LMP) metal or metal alloy as detailed hereinabove with respect to the metallic component embodiments. In further embodiments, the LMP metal or metal alloy powder comprises at least one metal selected from the group consisting of Sn, Bi, Pb, Cd, Zn, Ga, In, Te, Hg, Tl, Sb, Se, and Po. In still further embodiments, the LMP metal or metal alloy powder comprises tin or tin alloy. In yet further embodiments, the LMP metal or metal alloy powder comprises Sn and Bi. In certain embodiments, the LMP alloy comprises Sn/Bi alloy.

In some embodiments, the fluxing component comprises from about 0% (w/w) to about 90% (w/w) of the LMP metal or metal alloy out of the total weight of the fluxing component. In further embodiments, the fluxing component comprises from about 0% (w/w) to about 40%, or from about 40% to about 90% (w/w) of the LMP metal or metal alloy out of the total weight of the fluxing component. In some embodiments, the fluxing component comprises from about 10% (w/w) to about 80% (w/w) of the LMP metal or metal alloy, or from about 20% to about 70% (w/w) of the LMP metal or metal alloy, or from about 30% to about 60% (w/w) of the LMP metal or metal alloy out of the total weight of the fluxing component. Each possibility represents a separate embodiment of the invention. In further embodiments, the fluxing component comprises from about 0% (w/w) to about 80% (w/w) of the LMP metal or metal alloy out of the total weight of the fluxing component. In certain embodiments, said LMP metal or metal alloy is tin alloy or tin-bismuth alloy.

The inventors of the present invention have further shown that incorporation of a stabilizing agent in the two-component printable conductive composition, and in particular, into the fluxing component of the composition, affords for the formation of highly conductive and mechanically stable metallic traces or lines, when said composition is applied to a substrate and sintered. Without wishing to being bound by theory or mechanism of action, it is contemplated that the addition of the stabilizing agent allows to increase the pot life of the conductive composition following the mixing of the two components. The presence of the stabilizing agent can help maintaining the desired viscosity of the conductive composition following the mixing of the metallic component with the fluxing component and prior to printing.

According to some embodiments, the fluxing component further comprises at least one stabilizing agent, as detailed hereinabove with respect to the metallic component embodiments. In further embodiments, the stabilizing agent is selected from the group consisting of a thiol, thioamide, silane, alkane phosphonic acid, amine, urea and salts, combinations or derivatives thereof. In yet further embodiments, the stabilizing agent is selected from the group consisting of a thiol, thioamide, urea, and salts, combinations and derivatives thereof. In some embodiments, the thiol comprises an alkylthiol. In further embodiments, the alkylthiol is selected from octanethiol and dodecanethiol. In some embodiments, the thioamide comprises a thiourea. In further embodiments, the stabilizing agent comprises $SC(NH_2)_2$. In additional embodiments, the urea comprises a dimethyl urea.

According to some embodiments, the fluxing component comprises from about 0% (w/w) to about 20% (w/w) of the stabilizing agent out of the total weight of the fluxing component. According to further embodiments, the fluxing component comprises from about 0.05% (w/w) to about 20% (w/w) of the stabilizing agent out of the total weight of the fluxing component. According to some embodiments, the fluxing component comprises from about 0.1% (w/w) to about 20% (w/w) of the stabilizing agent. In some embodiments, the fluxing component comprises from about 0.5% (w/w) to about 7.5% (w/w) of the stabilizing agent. In some exemplary embodiments, the fluxing component comprises from about 1% (w/w) to about 5% (w/w) of the stabilizing agent. In certain embodiments, the stabilizing agent is thiourea. In additional embodiments, the stabilizing agent is selected from octanethiol and dodecanethiol.

According to some embodiments, the fluxing component further comprises at least one additive selected from an adhesion-promoting agent, anti-oxidant agent, and combinations thereof, as detailed hereinabove with respect to the metallic component embodiments.

According to some embodiments, the adhesion-promoting agent comprises an organic acid having one carboxylic group. According to some embodiments, the organic acid having one carboxylic group is selected from the group consisting of a resin acid, a fatty acid, and combinations or derivatives thereof. Non-limiting examples of suitable resin acids include abietic acid, pimaric acid, isopimaric acid, neoabietic acid, dihydroabietic acid, dehydroabietic acid, and the like. According to some embodiments, the fluxing component comprises rosin as an adhesion-promoting agent.

According to some embodiments, the fluxing component comprises from about 0% (w/w) to about 30% (w/w) of the additive out of the total weight of the fluxing component. According to some embodiments, the fluxing component comprises from about 0.05% (w/w) to about 20% (w/w) of the additive out of the total weight of the fluxing component. According to some embodiments, the fluxing component comprises from about 0.1% (w/w) to about 10% (w/w) of the additive. In some embodiments, the fluxing component comprises from about 0.5% (w/w) to about 7.5% (w/w) of the additive. In further embodiments, the fluxing component comprises from about 1% (w/w) to about 5% (w/w) of the additive. In additional embodiments, the fluxing component comprises from 10% (w/w) to about 20% (w/w) of the additive.

According to some embodiments, the fluxing component comprises from about 0% (w/w) to about 20% (w/w) of the adhesion-promoting agent out of the total weight of the fluxing component. According to some embodiments, the fluxing component comprises from about 0.05% (w/w) to about 15% (w/w) of the adhesion-promoting agent out of the total weight of the fluxing component. According to some embodiments, the fluxing component comprises from about 0.05% (w/w) to about 10% (w/w) or from about 10% (w/w) to about 20% (w/w) of the adhesion-promoting agent. In some embodiments, the fluxing component comprises from about 0.5% (w/w) to about 7.5% (w/w) of the adhesion-promoting agent. In further embodiments, the fluxing component comprises from about 1% (w/w) to about 5% (w/w) of the adhesion-promoting agent. In some embodiments, the fluxing component comprises about 4% (w/w) of the adhesion-promoting agent. In additional embodiments, the fluxing component comprises about 12% (w/w) of the adhesion-promoting agent. In further embodiments, said additive comprises a resin acid as an adhesion promoting agent.

In some embodiments, the fluxing component is essentially free of the fatty acid. In further embodiments, the fluxing component is essentially free of the adhesion-promoting agent.

In some embodiments, the metallic component, the fluxing component or both comprise LMP metal or metal alloy powder, which is pretreated with sodium borohydride.

According to some embodiments, the fluxing component has a viscosity ranging from about 100 to about 30,000 cP. According to further embodiments, the fluxing component has a viscosity ranging from about 200 to about 20,000 cP. According to still further embodiments, the fluxing component has a viscosity ranging from about 400 to about 10,000 cP. According to additional embodiments, the fluxing component has a viscosity ranging from about 100 to about 3,000 cP.

According to some embodiments, the two-component printable conductive composition of the present invention as presented hereinabove, comprises the metallic component comprising HMP metal or metal alloy powder; and LMP metal or metal alloy powder, and the fluxing component comprising organic acid having at least two carboxylic groups; adhesion-promoting agent; stabilizing agent and organic solvent. According to further embodiments, the two-component printable conductive composition of the present invention as presented hereinabove, comprises the metallic component comprising copper powder and tin alloy powder, and the fluxing component comprising citric acid; resin acid; stabilizing agent; and glycol diether. According to some embodiments, the two-component printable conductive composition of the present invention as presented hereinabove, comprises the metallic component comprising HMP metal or metal alloy powder, and the fluxing component comprising LMP metal or metal alloy powder; organic acid having at least two carboxylic groups; adhesion-promoting agent; stabilizing agent and organic solvent. According to further embodiments, the two-component printable conductive composition of the present invention as presented hereinabove, comprises the metallic component comprising copper powder, and the fluxing component comprising tin alloy powder; citric acid; resin acid; stabilizing agent; and glycol diether. In further embodiments, the stabilizing agent is thiourea.

According to some embodiments, the two-component printable conductive composition of the present invention as presented hereinabove, comprises the metallic component comprising HMP metal or metal alloy powder; LMP metal or metal alloy powder; and fluid dispersion medium, and the fluxing component comprising organic acid having at least two carboxylic groups; adhesion-promoting agent; and organic solvent. According to further embodiments, the two-component printable conductive composition of the present invention as presented hereinabove, comprises the metallic component comprising copper powder; tin powder; and glycol diether, and the fluxing component comprising citric acid; resin acid; and glycol diether.

According to some embodiments, the two-component printable conductive composition of the present invention as presented hereinabove, comprises the metallic component comprising HMP metal or metal alloy powder; adhesion-promoting agent; and fluid dispersion medium, and the fluxing component comprising organic acid having at least two carboxylic groups; LMP metal or metal alloy powder;

and the organic solvent. According to further embodiments, the two-component printable conductive composition of the present invention as presented hereinabove, comprises the metallic component comprising copper powder; resin acid; and glycol diether, and the fluxing component comprising citric acid; tin powder; and glycol diether.

According to some embodiments, the two-component printable conductive composition of the present invention as presented hereinabove, comprises the metallic component comprising HMP metal or metal alloy powder; LMP metal or metal alloy powder; adhesion-promoting agent and fluid dispersion medium, and the fluxing component comprising organic acid having at least two carboxylic groups; adhesion-promoting agent; and organic solvent. According to further embodiments, the two-component printable conductive composition of the present invention as presented hereinabove, comprises the metallic component comprising copper powder; tin powder; resin acid, and glycol diether, and the fluxing component comprising citric acid; resin acid; and glycol diether.

According to some embodiments, the two-component printable conductive composition of the present invention as presented hereinabove, comprises the metallic component comprising HMP metal or metal alloy powder; LMP metal or metal alloy powder; organic acid having at least two carboxylic groups; adhesion-promoting agent and fluid dispersion medium, and the fluxing component comprising organic acid having at least two carboxylic groups; adhesion-promoting agent; and organic solvent. According to further embodiments, the two-component printable conductive composition of the present invention as presented hereinabove, comprises the metallic component comprising copper powder; tin powder; resin acid, citric acid and glycol diether, and the fluxing component comprising citric acid; resin acid; and glycol diether.

According to some embodiments, the two-component printable conductive composition of the present invention as presented hereinabove, comprises the metallic component comprising HMP metal or metal alloy powder; and fluid dispersion medium, and the fluxing component comprising organic acid having at least two carboxylic groups; LMP metal or metal alloy powder; adhesion-promoting agent; and organic solvent. According to further embodiments, the two-component printable conductive composition of the present invention as presented hereinabove, comprises the metallic component comprising copper powder and glycol diether, and the fluxing component comprising citric acid; resin acid; tin powder; and glycol diether.

According to some embodiments, the two-component printable conductive composition of the present invention as presented hereinabove, comprises the metallic component comprising HMP metal or metal alloy powder; and fluid dispersion medium, and the fluxing component comprising LMP metal or metal alloy powder; organic acid having at least two carboxylic groups; adhesion-promoting agent; stabilizing agent and organic solvent. According to further embodiments, the two-component printable conductive composition of the present invention as presented hereinabove, comprises the metallic component comprising copper powder and glycol diether, and the fluxing component comprising tin alloy powder; citric acid; resin acid; stabilizing agent; and glycol diether. In further embodiments, the stabilizing agent is thiourea.

According to some embodiments, the two-component printable conductive composition of the present invention as presented hereinabove, comprises the metallic component comprising HMP metal or metal alloy powder; LMP metal or metal alloy powder; and fluid dispersion medium, and the fluxing component comprising organic acid having at least two carboxylic groups; adhesion-promoting agent; stabilizing agent and organic solvent. According to further embodiments, the two-component printable conductive composition of the present invention as presented hereinabove, comprises the metallic component comprising copper powder; tin alloy powder; and glycol diether, and the fluxing component comprising citric acid; resin acid; stabilizing agent; and glycol diether. In further embodiments, the stabilizing agent is thiourea.

According to certain embodiments, the two-component printable conductive composition of the present invention comprises:
1. the metallic component comprising the following ingredients:
   from about 30% (w/w) to about 70% (w/w) copper powder; from about 25% (w/w) to about 65% (w/w) tin alloy powder; and from about 5% (w/w) to about 15% (w/w) glycol diether, and
2. the fluxing component comprising the following ingredients:
   from about 30% (w/w) to about 60% (w/w) citric acid; from about 1% (w/w) to about 20% (w/w) resin acid; and from about 5% (w/w) to about 70% (w/w) glycol diether.

According to certain embodiments, the two-component printable conductive composition of the present invention comprises:
1. the metallic component comprising the following ingredients:
   from about 35% (w/w) to about 75% (w/w) copper powder; and from about 25% (w/w) to about 65% (w/w) tin alloy powder, and
2. the fluxing component comprising the following ingredients:
   from about 5% (w/w) to about 50% (w/w) citric or tartaric acid; from about 1% (w/w) to about 20% (w/w) resin acid; and from about 5% (w/w) to about 60% (w/w) glycol diether.

According to certain embodiments, the two-component printable conductive composition comprises:
1. the metallic component comprising the following ingredients:
   from about 35% (w/w) to about 75% (w/w) copper powder; and from about 25% (w/w) to about 65% (w/w) tin alloy powder, and
2. the fluxing component comprising the following ingredients:
   from about 5% (w/w) to about 50% (w/w) citric acid or tartaric acid; from about 0.1% (w/w) to about 20% (w/w) thiourea; and from about 5% (w/w) to about 60% (w/w) glycol diether.

According to certain embodiments, the two-component printable conductive composition comprises:
1. the metallic component comprising the following ingredients:
   from about 35% (w/w) to about 75% (w/w) copper powder; and from about 25% (w/w) to about 65% (w/w) tin alloy powder, and
2. the fluxing component comprising the following ingredients:
   from about 5% (w/w) to about 50% (w/w) citric acid; from about 0.1% (w/w) to about 20% (w/w) thiourea; from about 1% (w/w) to about 20% (w/w) resin acid; and from about 5% (w/w) to about 60% (w/w) glycol diether.

According to certain embodiments, the two-component printable conductive composition comprises:
1. the metallic component comprising:
   about 100% (w/w) copper powder, and
2. the fluxing component comprising the following ingredients:
   from about 2% (w/w) to about 30% (w/w) citric acid; from about 50% (w/w) to about 80% (w/w) tin alloy powder; from about 1% (w/w) to about 20% (w/w) resin acid; and from about 3% (w/w) to about 30% (w/w) glycol diether.

According to certain embodiments, the two-component printable conductive composition comprises:
1. the metallic component comprising:
   about 100% (w/w) copper powder, and
2. the fluxing component comprising the following ingredients:
   from about 2% (w/w) to about 30% (w/w) citric acid or tartaric acid; from about 50% (w/w) to about 80% (w/w) tin alloy powder; from about 0.1% (w/w) to about 20% (w/w) thiourea; from about 1% (w/w) to about 20% (w/w) resin acid; and from about 3% (w/w) to about 30% (w/w) glycol diether.

According to some embodiments, the two-component printable conductive composition has a shelf life of at least about 1 month. According to further embodiments, the two-component printable conductive composition has a shelf life of at least about 6 months. According to still further embodiments, the two-component printable conductive composition has a shelf life of at least about 1 year.

According to some embodiments, the two-component printable conductive composition has a pot life of at least about 3 hours. According to further embodiments, the two-component printable conductive composition has a pot life of at least about 5 hours. According to still further embodiments, the two-component printable conductive composition has a pot life of at least about 10 hours. According to yet further embodiments, the two-component printable conductive composition has a pot life of at least about 15 hours. According to still further embodiments, the two-component printable conductive composition has a pot life of at least about 24 hours. In certain embodiments, the two-component printable conductive composition comprises a stabilizing agent.

According to some embodiments, the two-component printable conductive composition of the present invention comprises, following mixing of the two separate components, the HMP metal or metal alloy powder having a mean particle size below about 15 μm, the organic acid having at least two carboxylic groups and the organic solvent. According to further embodiments, the two-component printable conductive composition comprises, following mixing of the two separate components, the HMP metal or metal alloy powder, the LMP metal or metal alloy powder, the organic acid having at least two carboxylic groups, and the organic solvent. According to still further embodiments, the two-component printable conductive composition comprises, following mixing of the two separate components, the HMP metal or metal alloy powder, the organic acid having at least two carboxylic groups, the organic solvent, and the stabilizing agent. According to yet further embodiments, the two-component printable conductive composition comprises, following mixing of the two separate components, the HMP metal or metal alloy powder, the LMP metal or metal alloy powder, the organic acid having at least two carboxylic groups, the organic solvent, and the stabilizing agent. According to yet further embodiments, the two-component printable conductive composition comprises, following mixing of the two separate components, the HMP metal or metal alloy powder, the LMP metal or metal alloy powder, the organic acid having at least two carboxylic groups, the organic solvent, the stabilizing agent, and the adhesion-promoting agent.

In a certain embodiment, the two-component printable conductive composition comprises, following mixing of the two separate components, copper powder, tin alloy powder, citric or tartaric acid, and glycol diether. In a further embodiment, the two-component printable conductive composition comprises, following mixing of the two separate components, copper powder, tin alloy powder, citric or tartaric acid, glycol diether, and thiourea. The two-component printable conductive composition can comprise, following mixing of the two separate components, from about 20% (w/w) to about 60% (w/w) copper powder, from about 15% (w/w) to about 55% (w/w) tin alloy powder, from about 5% (w/w) to about 20% (w/w) citric or tartaric acid, from about 5% (w/w) to about 20% (w/w) glycol diether, and from about 1% (w/w) to about 10% (w/w) thiourea. In a further embodiment, the two-component printable conductive composition comprises, following mixing of the two separate components, copper powder, tin alloy powder, citric or tartaric acid, glycol diether, thiourea, and resin acid. The two-component printable conductive composition can comprise, following mixing of the two separate components, from about 20% (w/w) to about 60% (w/w) copper powder, from about 15% (w/w) to about 55% (w/w) tin alloy powder, from about 5% (w/w) to about 20% (w/w) citric or tartaric acid, from about 5% (w/w) to about 20% (w/w) glycol diether, from about 1% (w/w) to about 10% (w/w) thiourea, and from about 0.5% (w/w) to about 5% (w/w) resin acid.

According to some embodiments, the weight percent of a particulate matter comprising the HMP metal or metal alloy powder and the LMP metal or metal alloy powder, following mixing of the metallic component with the fluxing component, ranges from about 75% to about 90% of the total weight of the mixed two-component composition.

According to some embodiments, the metallic component is formed by placing the HMP metal or metal alloy powder and the fluid dispersion medium in a container and mixing manually or by using a mechanical mixer. In additional embodiments, the metallic component further comprises the LMP metal or metal alloy powder, the additive or both. In certain such embodiments, the metallic component is formed by placing the HMP metal or metal alloy powder, the fluid dispersion medium, and at least one of the LMP metal or metal alloy powder and the additive in the container and mixing manually or by using a mechanical mixer.

According to some embodiments, the metallic component is formed by mixing the HMP metal or metal alloy powder with the LMP metal or metal alloy powder. According to additional embodiments, the metallic component consists solely of the HMP metal or metal alloy powder.

In some embodiments, the fluxing component is formed by:
(a) dissolving the organic acid having at least two carboxylic groups in the organic solvent, thus forming a solution. In further embodiments, the process comprises:
(b) adding rosin as an adhesion-promoting agent; and
(c) heating and mixing of the solutions of steps (a) and (b) to a specific temperature, until the complete dissolving of the acid and rosin.

In some embodiments, step (b) further comprises the addition of the stabilizing agent.

In further embodiments, the organic acid having at least two carboxylic groups is citric acid or tartaric acid. In yet still further embodiments, the organic solvent comprises ethylene glycol dimethyl ether. In still further embodiments, the specific temperature in step (c) is selected from the range of about 50 to about 100° C. In yet still further embodiments, the specific temperature is selected from the range of about 80 to about 100° C.

According to some embodiments of the present invention, the two-component printable conductive composition as presented hereinabove is configured for use as a conductive ink for trace printing on a substrate in the process of manufacturing of printed electronic devices. The term "printed electronic device", as used herein, refers to an at least partially or fully functional electronic device, or circuitry which may conduct electricity and which is formed by depositing a conductive material onto the surface of a substrate using a printing device or process or any other deposition process as known in the art. Accordingly, the term "printed" electronic features is not intended to be limiting, but is only used for convenience.

Non-limiting examples of printed electronic devices include a printed circuit board (PCB), antenna, RFID device, display, solar cell, heater, electrode, battery, keypad, switch, sensor, medical device, or any combination thereof. The terms "printed electronic device" and "electronic device" can be used interchangeably.

An antenna is an electrical device which converts electric power into radio waves and vice versa, and can be used in systems such as radio broadcasting, broadcast television, two-way radio, communications receivers, radar, cell phones, satellite communication, wireless microphones, Bluetooth-enabled devices, wireless computer networks, baby monitors, etc.

A Radio-frequency identification (RFID) device uses electromagnetic fields to automatically identify and track tags attached to objects, wherein the tags can contain electronically stored information. RFID devices can be used in commerce such as for tracking goods, access control devices such as identification badges, advertising, transportation, logistics, etc.

A display device is an output device for presentation of visual information, and can include in a variety of applications, such as television sets, computer monitors, head-mounted display, medical monitors, etc.

A solar cell (or photovoltaic cell) is an electrical device which can convert light energy into electricity by the photovoltaic effect and can be used to provide electricity.

Heaters can convert electrical energy in to heat, and can be used for the heating of space, heating of liquids, heating of solids, industrial electric heating, etc.

An electrode is an electrical conductor used to make contact with a nonmetallic part of a circuit, such as a semiconductor or an electrolyte, and can be used in a variety of electric devices, such as fuel cells, supercapacitors, medical devices, batteries, membrane electrode assembly, etc.

A keypad is a set of buttons arranged in a block or "pad" which bear digits, symbols or alphabetical letters, for use in alphanumeric keyboards and other devices which require mainly numeric input such as calculators, push-button telephones, vending machines, ATMs, keyboards, combination locks, digital door locks, or more.

A sensor is an electronic device or subsystem whose purpose is to detect events or changes in its environment, such as temperature, pressure or materials concentration, and send the information to other electronics, frequently a computer processor.

A heater is a resistive element that generates heat as a result of electric current. The printed ink can be used either as the resistive element, as a conductor, or both.

In some embodiments, the printed electronic device is a rigid component. In some embodiments, the printed device component is flexible component. The electronic device can have a planar surface, a non-planar surface, a three-dimensional (3D) shape or surface, or any combination thereof.

According to yet another aspect, the present invention provides a kit comprising the two-component printable conductive composition as presented hereinabove, wherein the metallic component and the fluxing component are disposed in separate containers. According to some embodiments, the kit further comprises a dosing apparatus configured to provide a predetermined volume or weight of the metallic component and a predetermined volume or weight of the fluxing component. The term "predetermined volume" as used herein, refers to an adjustable volume chosen by the user. Alternatively, the desirable dose of the metallic component and of the fluxing component can be measured by means of conventional equipment, such as, for example, balance.

According to some embodiments, the kit further comprises instructions for mixing the metallic component with the fluxing component. In further embodiments, the instructions direct that the weight ratio of the metallic component and the fluxing component ranges from about 10:1 to about 1:3. In still further embodiments, the instructions direct that the weight ratio of the metallic component and the fluxing component ranges from about 5:1 to about 2:1.

In some embodiments, the instructions direct that the viscosity of the mixture of the metallic component and the fluxing component ranges from about 2,000 cP to about 300,000 cP. In further embodiments, the instructions direct that the viscosity of the mixture of the metallic component and the fluxing component ranges from about 5,000 cP to about 150,000 cP. In additional embodiments, the instructions direct that the viscosity of the mixture of the metallic component and the fluxing component ranges from about 2,000 cP to about 30,000 cP.

In some embodiments, the instructions direct that the mixture of the metallic component and the fluxing component is used for printing within less than about 24 hours following the mixing. In further embodiments, the instructions direct that the mixture of the metallic component and the fluxing component is used for printing within less than about 15, hours, 10 hours, 6 hours, 5 hours or 3 hours following the mixing. Each possibility represents a separate embodiment of the invention.

In some embodiments, the viscosity of the mixture of the metallic component and the fluxing component ranges from about 2,000 cP to about 300,000 cP. In further embodiments, the viscosity of the mixture of the metallic component and the fluxing component ranges from about 5,000 cP to about 150,000 cP. In additional embodiments, the viscosity of the mixture of the metallic component and the fluxing component ranges from about 2,000 cP to about 30,000 cP.

According to yet another aspect, the present invention provides a method for deposition and patterning of the two-component conductive composition as presented hereinabove, comprising: (a) mixing the metallic component with the fluxing component; and (b) applying the mixture obtained in step (a) to an insulating substrate.

In some embodiments, the weight ratio of the metallic component and the fluxing component is step (a) ranges from about 20:1 to about 1:3. In further embodiments, the weight ratio of the metallic component and the fluxing component is step (a) ranges from about 20:1 to about 2:1. In still further embodiments, the weight ratio of the metallic component and the fluxing component is step (a) ranges from about 10:1 to about 2:1. In yet further embodiments, the weight ratio of the metallic component and the fluxing component is step (a) ranges from about 8:1 to about 3:1.

In some embodiments, the viscosity of the mixture obtained in step (a) ranges from about 2,000 cP to about 300,000 cP. In further embodiments, the viscosity of the mixture of the metallic component and the fluxing component ranges from about 5,000 cP to about 150,000 cP. In additional embodiments, the viscosity of the mixture of the metallic component and the fluxing component ranges from about 2,000 cP to about 30,000 cP.

In some embodiments, the time period between step (a) and step (b) is less than about 24 hours. In some embodiments, the time period between step (a) and step (b) is less than about 15 hours, 10 hours, 6 hours, 5 hours or 3 hours. Each possibility represents a separate embodiment of the invention.

In some embodiments, the method further comprises step (c) comprising heating the applied composition to a sintering temperature for a period of time sufficient to sinter the conductive composition. In some embodiments, said temperature ranges from about 120 to about 250° C. In certain embodiments, said temperature ranges from about 130 to about 160° C. In additional embodiments, the sintering time ranges from about 1 to about 6 minutes.

Without wishing to being bound by theory or mechanism of action, it is contemplated that during the heating of the conductive composition, Liquid Phase Sintering (LPS) and/or TLPS occurs, forming conductive traces. According to some embodiments, during the heating of the conductive composition, sintering occurs without melting the HMP metal or HMP metal alloy powder. In some embodiments, during the heating of the conductive composition, from about 50% to about 100% of the LMP metals or metal alloy powders undergoes melting, and wet the HMP metal or metal alloy powder.

In some embodiments, the conductive composition is applied directly onto at least one surface of the substrate. The substrate can be a rigid or a flexible substrate. In some embodiments, the substrate comprises a material selected from a semiconductor, plastic, glass, fiberglass, silicon, ceramics, epoxy, polymer, and a composite material. Non-limiting examples of suitable polymer substrates include polyethylene terephthalate (PET), polyamide (PA), epoxies, cellulose-based films, polyimides, such as, but not limited to, Kapton®, and polyurethanes. In some exemplary embodiments, the electronic device is a PCB and the substrate is a FR-4 glass epoxy substrate.

In some embodiments, the substrate further comprises one or more vias. In certain such embodiments, the vias allow electrical interconnection between the top and the bottom surfaces of the substrate.

According to some embodiments, the heating of the conductive composition is performed by an external heating source. Non-limiting examples of suitable external heating sources include focused IR, indirect IR, halogen lamp, laser beam, hot air, UV, and combinations thereof. Each possibility represents a separate embodiment of the invention.

In some embodiments, the step of applying the mixture obtained in step (a) is performed by a method selected from the group of 3D printing, inkjet printing, dispensing, screen printing, stencil printing, doctor blading, spraying, brushing, rolling, pad transfer, laser induced forward printing, imprinting and manual layering. Each possibility represents a separate embodiment of the invention. In certain embodiments, the step of applying the conductive composition is performed by 3D printing, inkjet printing, or screen-printing.

As used herein, the term "3D printing" or "additive manufacturing (AM)" refers to processes used to create a three-dimensional object in which layers of material are formed under a computer-controlled program to create the object, using known 3D processing techniques. 3D printing or AM methods can produce a three-dimensional object utilizing a computer-aided design (CAD) model. The non-limiting examples of 3D processing techniques include: Fused deposition modeling (FDM), Direct Ink Writing (DIW), Powder bed and inkjet head 3D printing (3DP), Electron-beam melting (EBM), Selective laser melting (SLM), Selective laser sintering (SLS), or Direct metal laser sintering (DMLS) and Laser Induced Forward Transfer (LIFT).

In some embodiments, the step of applying mixture obtained in step (a) to the substrate comprises forming a predefined pattern on the at least one surface of the substrate. In some embodiments, the application or deposition of the composition defines the pattern and the shape of the conductive traces. As used herein, the term "shape" refers to the geometric dimensions in a Cartesian coordinate 3-dimensional system. In further embodiments, the predefined pattern is controlled by the printing machine or equipment, such a printer or a screen. In other embodiments, the step of applying the composition comprises applying a mask to the at least one surface of the substrate and applying the conductive composition to the remaining bare surface of the substrate, uncovered by the mask.

According to another aspect, the present invention provides a printed electronic device comprising at least one conductive trace obtained by the method of the present invention as presented herein above. The printed electronic device can be selected from a printed circuit board (PCB), antenna, RFID device, display, solar cell, heater, electrode, battery, keypad, switch, sensor, medical device, or any combination thereof.

In some embodiments, the thickness of said conductive trace ranges from about 1 μm to about 30 μm. In further embodiments, the thickness of said conductive trace ranges from about 1 μm to about 25 μm. In yet further embodiments, the thickness of said conductive trace ranges from about 1 μm to about 20 μm. In still further embodiments, the thickness of said conductive trace ranges from about 1 μm to about 10 μm.

In some embodiments, the conductive trace has a resistance in the range of about 1 to about 100 mOhm/sq. In yet still further embodiments, the conductive trace has a resistance in the range of about 20 to about 50 mOhm/sq. In further embodiments, the thickness of said conductive trace is about 25 μm.

As used herein and in the appended claims the singular forms "a", "an," and "the" include plural references unless the content clearly dictates otherwise. It should be noted that the term "and" or the term "or" is generally employed in its sense including "and/or" unless the content clearly dictates otherwise. As used herein, the term "about", when referring to a measurable value such as an amount, a temporal duration, and the like, is meant to encompass variations of +/−10%, more preferably +/−5%, even more preferably +/−1%, and still more preferably +/−0.1% from the specified value, as such variations are appropriate to perform the disclosed methods.

The following examples are presented in order to more fully illustrate some embodiments of the invention. They should, in no way be construed, however, as limiting the broad scope of the invention. One skilled in the art can readily devise many variations and modifications of the principles disclosed herein without departing from the scope of the invention.

EXAMPLES

Comparative Example 1: Single Component Printable Composition Comprising Off-the-Shelf Flux A single component printable composition was prepared by mixing the following ingredients (by weight percentages):

43% copper particles having a mean diameter of 3 μm;
35% $Sn_{42}/Bi_{58}$ alloy powder having particles with a mean diameter of 3 μm; and
22% commercial flux (either RMA258-15R or NC paste flux from AIM Metals & Alloys LP (AIM)).

The single component printable composition was screen printed on a polyethylene terephthalate (PET) substrate forming a pattern of a 50 mm long and 2 mm wide line, having a film thickness of 20 μm. The sample was placed in a forced-air oven for sintering at 150° C. Upon cooling, the trace line resistance was measured by a Fluke 8845A multimeter in a 4-wire sensing mode. The sample was not conductive.

Example 1: Printable Conductive Composition Comprising Activated Flux

In order to increase conductivity of the printed composition, and in particular to prevent oxidation of copper during sintering, an activated flux was prepared, having the following composition:

41% citric acid;
7% gum rosin; and
52% glycol diether.

5 g of the activated flux were mixed with 18 g of a metallic component to obtain a printable composition with the following ingredients (by weight percentages):

43% copper particles having a mean diameter of 3 μm;
35% $Sn_{42}/Bi_{58}$ alloy powder having particles with a mean diameter of 3 μm; and
22% activated flux.

Immediately after mixing, this composition was screen printed on a PET substrate forming a pattern of a 50 mm long and 2 mm wide line, having a thickness of 15 μm. The sample was placed in a hot-air oven for sintering at 150° C. for 5 minutes. Upon cooling, the trace line resistance was measured by a Fluke 8845A multimeter in a 4-wire sensing mode. The sample was conductive. It was therefore shown that the activated flux comprising citric acid effectively protects micron-sized copper particles during sintering.

Example 2: Stability of the Printable Composition Comprising Activated Flux

In order to test stability of the printable composition comprising activated flux, the viscosity of the mixed composition described in Example 1, which was held at room temperature, was measured hourly by Brookfield digital viscometer. After each viscosity measurement, a trace line was printed and sintered at 150° C. and its resistance was measured.

Resistance and viscosity of the printable composition as a function of time following mixing of its ingredients are shown in FIG. 1. It can be seen that the printable composition comprising activated flux is stable at room temperature for about 2-3 hours. Without wishing to being bound by theory or mechanism of action, it was assumed that the degradation of the conductive composition properties can be attributed to the reaction between citric acid and metal particles and formation of high molecular-weight metal-citrate complexes. It was concluded that in view of the high reactivity of the activated flux, the metallic component comprising micron-sized copper particles should be prepared and stored separately from the activated flux and mixed therewith just before printing.

Example 3: Activated Fluxes Comprising Different Carboxylic Acids

Additional carboxylic acids were tested by replacing citric acid in the activated flux of the composition presented in Examples 1 and 2. These activated fluxes were combined with the metallic component and tested for resistance and viscosity, as described in Example 2. Table 1 lists these carboxylic acids and their properties together with qualitative resistance and viscosity test results.

Figure 2:
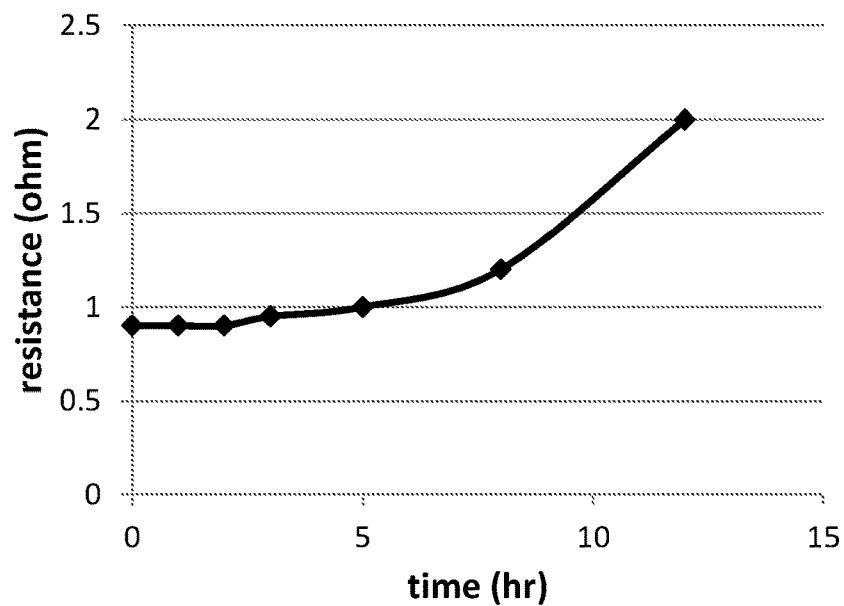
FIG. 2 depicts a graph of resistance of a trace line obtained from a conductive composition comprising activated flux comprising tartaric acid as a function of time following mixing of the components of said composition.

The two most promising acids found were citric and tartaric acids, demonstrating good solubility, and consequently yielding good flux properties. Resistance of the trace line obtained by printing tartaric acid-based composition as a function of time following mixing of composition ingredients is shown in FIG. 2.

Trace lines obtained from a printable composition comprising maleic acid had a resistance of above 20 Ohm, which is more than 30 times larger than that of the citric acid-based ink.

Oxalic acid-based ink reacted too fast at room temperature following mixing of its components. Its viscosity has increased within a few minutes such that it was not suitable for printing. Thus, said ink was not tested for resistance.

Resistance of a trace line obtained from the ink containing acetic acid was about 2 kOhm.

TABLE 1

Activated fluxes comprising different organic acids and their effect on the printed composition properties

| Acid type | No. of carboxylic groups | $pK_{a1}$ | Solubility in solvent* | Resistance of the printed film* | Viscosity of the mixed composition* |
|---|---|---|---|---|---|
| Citric | 3 | 3.13 | 5 | 5 | 5 |
| Maleic | 2 | 1.9 | 5 | 3 | 5 |
| Oxalic | 2 | 1.25 | 5 | — | 1 |
| Acetic | 1 | 4.76 | 5 | 2 | 5 |
| Fumaric | 2 | 3.03 | 1 | 1 | 1 |
| Tartaric | 2 | 2.89 | 4 | 4 | 5 |

*Relative scale: good (5) - poor (1)

It was therefore assumed that the two important factors affecting activated flux properties are acidity and number of carboxylic groups. When using carboxylic acids having low acidity, the flux activity was poor. For example, the acidity of a carboxylic acid having a single carboxylic group (i.e., acetic acid) is too low. It is therefore prerequisite that the organic acid of the fluxing component has two carboxylic groups. Preferably, said organic acid should also have pKa of up to about 4. On the other hand, highly acidic carboxylic acids (such as, for example, oxalic acid) can react with the copper particles quickly at room temperature or at a higher temperature before sintering begins, thereby negatively affecting viscosity of the mixed composition and conductivity of the printed composition, and decreasing the pot life of the two-component composition.

Example 4: Shelf Life of a Two-Component Composition (Composition A)

A printable conductive composition was prepared, comprising two separately kept components: a metallic component, and a fluxing component (Composition A).

The metallic component was composed of (by weight percentages):
- 55% copper particles having a mean diameter of 3 μm; and
- 45% $Sn_{42}/Bi_{58}$ alloy powder having particles with a mean diameter of 3 μm;

The powders were mixed well and held in a closed glass jar at room temperature.

The flux component was composed of (by weight percentages):
- 41% citric acid;
- 7% gum rosin;
- 52% glycol diether The flux constituents were dissolved in methanol and distilled while mixing until the entire methanol was evaporated. The fluxing component was then held at room temperature in a closed glass jar.

After 1 month of storage both components were mixed at a proportion of 3.6:1 (by weight) and viscosity and resistance of the mixed printed composition were tested as described in Example 2. The results were similar to those obtained in Example 2 and the two-component composition comprising activated flux was suitable for printing even after 1 month of storage. It was therefore concluded that keeping the metallic component separately from the fluxing component provides a two-component printable conductive composition having sufficient shelf life. Since the metallic component contained both copper powder and tin-bismuth alloy powder, it is assumed that the degradation of performance of the composition presented in Example 2 is related to chemical reaction between the activated flux and the metallic component, i.e., the copper particles, the tin alloy particles or both.

Example 5: Shelf life of a two-component composition (Composition B)

An additional printable conductive composition was prepared, comprising two separately kept components: a metallic component, and a fluxing component (Composition B).

The metallic component was composed of:
- 100% copper particles having a mean diameter of 3 μm; held in a closed glass jar at room temperature.

The flux component was composed of (by weight percentages):
- 67% $Sn_{42}/Bi_{58}$ alloy powder having particles with a mean diameter of 3 μm;
- 12% citric acid;
- 4% gum rosin;
- 17% glycol diether held in a closed glass jar at room temperature.

After 1 month the two components were mixed at a proportion of 0.75:1 (by weight) and tested as described in Example 2. Results were similar to those presented in Example 4. Composition B was also suitable for printing after 1 month of storage. Since the metallic component of Composition B contained only copper powder, while tin-bismuth alloy powder was present in the fluxing component together with citric acid, it was concluded that the degradation of performance presented in Example 2 is attributed to the chemical interactions between the activated flux and the copper particles. It is therefore prerequisite that the metallic component comprising copper powder be kept separately from the fluxing component.

Example 6—Additional Two-Component Composition Formulation (Composition C)

An additional printable conductive composition was prepared, comprising two separately kept components: a metallic component, and a fluxing component (Composition C).

The metallic component was composed of (by weight percentages):
- 48% of copper powder having a mean diameter of about 3 μm;
- 43% of tin powder having a mean diameter of about 4 μm; and
- 9% of glycol diether.

The fluxing component was composed of (by weight percentages):
- 80% of citric acid;
- 17% of glycol diether; and
- 3% of rosin.

The metallic component was prepared by:
(a) dispersing the copper and the tin powders in glycol diether; and
(b) forming a mixture by mixing for 10 minutes at 25° C., until a uniform mixture was achieved with a viscosity of about 50000 cP.

The fluxing component was prepared by:
(a) forming a solution by dissolving citric acid in methanol and mixing for 30 minutes;
(b) adding rosin and glycol diether to the solution from step (a) and mixing for 10 minutes; and
(c) heating the solution to 80-100° C., until a uniform mixture was achieved.
(d) The metallic component and the fluxing component were kept separately at a temperature of 25° C. for a duration of 24 hours prior to printing.

Then the two components were mixed at a proportion of 3:1 (by weight). The two-component printable conductive composition (composition C) was printed by layering the composition between 2 tapes on a glass substrate, forming a 50 mm long by 2.5 mm wide conductive layer, having a thickness (height) of 40 μm. After removing the tapes, the sample was placed in an oven for sintering at 150° C., until a conductive trace line was formed.

The printed composition (composition C) was characterized by measuring its resistance, adhesion to the substrate, and its soldering properties.

The resistance of the conductive line was measured by a Fluke 8845A multimeter in a 4-wire sensing mode. The measured resistance was approx. 0.4 Ohm which is equivalent to 20-50 mOhm/sq for a 25 μm thick line.

The adhesion to the substrate was determined by attaching a 3M 250 Scotch tape to the surface of the printed glass, followed by pulling up the tape and observing the printed line for defects.

The printed line was connected to a thin copper wire by soldering with a commercial solder paste. Connection between the line and the wire was found to be acceptable.

The two-component printable conductive composition (composition C) was further printed by screen printing on a PET substrate, forming a 100 mm long by 1 mm wide conductive layer, having a thickness (height) of 0.01 mm. The conductive printed layer was in the form of a curved line (zig-zag) on the PET substrate. The printed substrate was then placed in an oven for sintering at 150° C., until a conductive layer was formed. The resistance measured by a Fluke 8845A multimeter in a 4-wire sensing mode. The measured resistance was approx. 5 Ohm which is equivalent to 20-50 mOhm/sq for a 25 µm thick line.

Example 7—Additional Two-Component Composition Formulation (Composition D)

An additional printable conductive composition is prepared, comprising two separately kept components: a metallic component, and a fluxing component (Composition D).

The metallic component is composed of (by weight percentages):
90% of a copper powder having a mean diameter of about 3 µm; and
10% of glycol diether.

The fluxing component is composed of (by weight percentages):
20% of citric acid;
70% of tin powder having a mean diameter of about 4 µm;
1% of rosin; and
9% of glycol diether.

Example 8: Extension of Pot Life Using a Stabilizing Agent

In order to evaluate pot life of a two-component composition, the following two separate components of said composition were mixed:

The metallic component was composed of (by weight percentages):
55% copper particles having a mean diameter of 3 µm; and
45% $Sn_{42}/Bi_{58}$ alloy powder having particles with a mean diameter of 3 µm.

The flux component was composed of (by weight percentages):
36% citric acid;
12% gum rosin;
4% thiourea;
48% glycol diether.

The two components were mixed at a proportion of 3.6:1 (by weight). The mixed composition was held at room temperature and its viscosity was measured hourly by Brookfield digital viscometer. Following each viscosity measurement, a line was printed on a glass substrate, the line being 50 mm long, 2 mm wide, and 40 µm thick. The printed ink was then sintered in a forced-air oven at 150° C. and the resistance of the obtained printed line was measured.

Figure 3A:
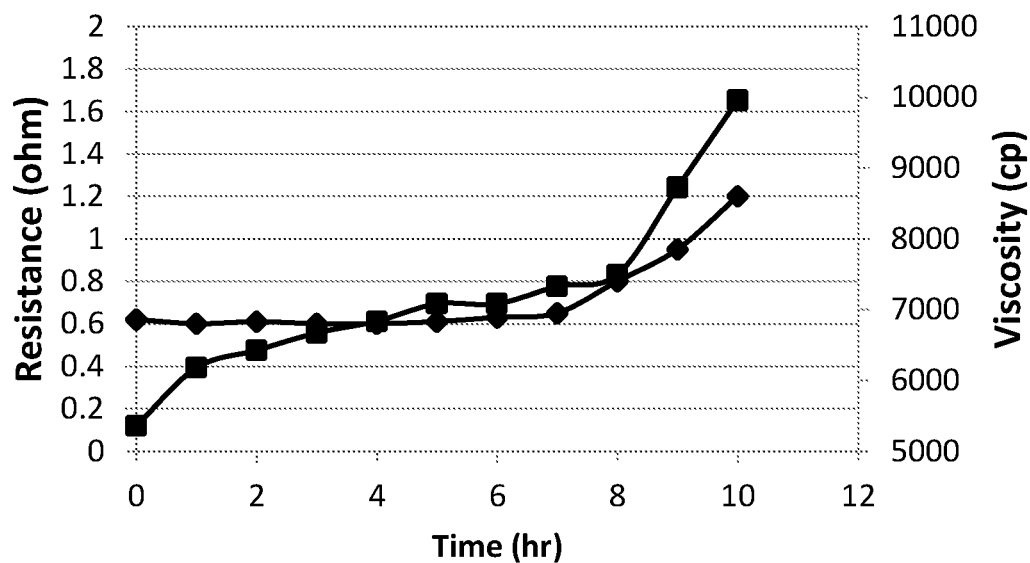
FIG. 3A depicts a graph of viscosity (squares) of the two-component composition comprising thiourea as a stabilizing agent and resistance (diamonds) of a trace line obtained from said composition as a function of time following mixing of the two components.

The pot life (resistance and viscosity) of the composition is shown in FIG. 3A. It can be seen that thiourea acts as a stabilizing agent extending the pot life of the two-component composition.

Example 9: Alternative Stabilizing Agents

Figure 3B:
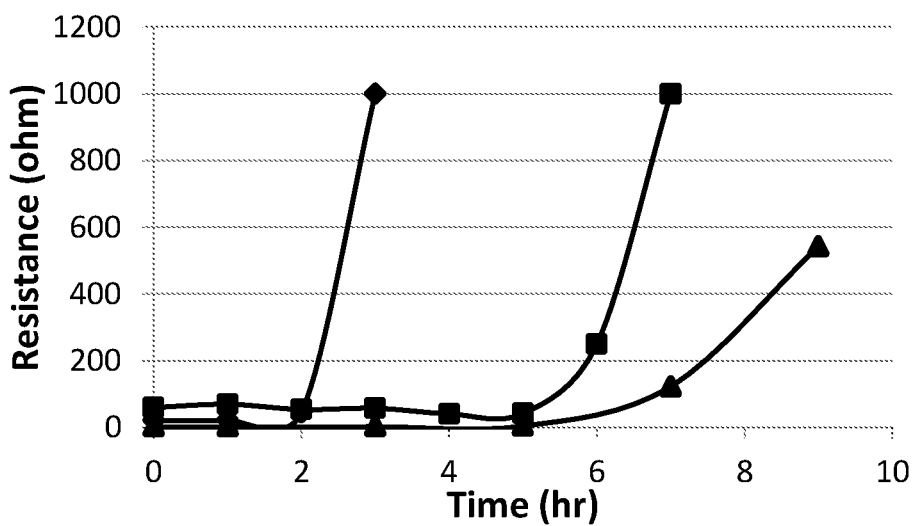
FIG. 3B depicts a graph of viscosity of the two-component composition comprising dodecanethiol (squares) and octanethiol (triangles) as stabilizing agents as a function of time following mixing of the two components as compared to a two-component composition without a stabilizing agent (diamonds).

Example 8 was repeated with a two-component composition comprising a thiol-based stabilizing agent instead of thiourea. The tested stabilizing agents included dodecanethiol and octanethiol. Resistance of the printed compositions as a function of time following mixing of the metallic component and the fluxing component are shown in FIG. 3B. It can be seen that both dodecanethiol and octanethiol extend the pot life of the ink as compared to a composition, which does not include a stabilizing agent in terms of resistivity. Viscosity behavior showed a similar trend (i.e., smaller viscosity increase as compared to a composition without a stabilizing agent).

It is appreciated by persons skilled in the art that the present invention is not limited by what has been particularly shown and described hereinabove. Rather the scope of the present invention includes both combinations and sub-combinations of various features described hereinabove as well as variations and modifications. Therefore, the invention is not to be constructed as restricted to the particularly described embodiments, and the scope and concept of the invention will be more readily understood by references to the claims, which follow.

What is claimed is:

1. A two-component printable conductive composition comprising, as separate components ready for mixing:
    (a) a metallic component comprising a high melting point (HMP) metal or metal alloy powder having a mean particle size below about 15 µm; and
    (b) a fluxing component comprising an organic acid characterized by having at least two carboxylic groups and a first logarithmic acid dissociation constant ($pK_{a1}$) of at most about 4 and an organic solvent,
    wherein the two components are maintained separately and mixed prior to use.

2. The composition according to claim 1, wherein the metallic component, the fluxing component, or both further comprise a stabilizing agent selected from the group consisting of a thiol compound, thioamide compound, urea compound, and salts, combinations and derivatives thereof.

3. The composition according to claim 2, wherein the stabilizing agent is selected from the group consisting of thiourea, octanethiol, dodecanethiol, dimethyl urea, and combinations thereof.

4. The composition according to claim 3, wherein the stabilizing agent comprises thiourea ($SC(NH_2)_2$).

5. The composition according to claim 2, wherein the fluxing component comprises from about 0.1% (w/w) to about 20% (w/w) of the stabilizing agent out of the total weight of the fluxing component.

6. The composition according to claim 1, wherein the organic acid is selected from the group consisting of citric acid, tartaric acid, malic acid, maleic acid, malonic acid, glutamic acid, phthalic acid, fumaric acid, and isomers and combinations thereof.

7. The composition according to claim 1, wherein the organic acid is citric acid or tartaric acid.

8. The composition according to claim 1, wherein the fluxing component comprises from about 2% (w/w) to about 60% (w/w) of the organic acid out of the total weight of the fluxing component.

9. The composition according to claim 1, wherein the organic solvent is selected from the group consisting of a glycol diether, ester, halogenated aromatic compound, and combinations thereof.

10. The composition according to claim 9, wherein the glycol diether is selected from the group consisting of propylene glycol dimethyl ether, diethylene glycol dimethyl ether, ethylene glycol dimethyl ether, ethylene glycol diethyl ether, ethylene glycol dipropyl ether, diethylene glycol diethyl ether, triethylene glycol butyl methyl ether, tetraethylene glycol dimethyl ether, dipropylene glycol dimethyl ether, polyethylene glycol dimethyl ether, and combinations thereof.

11. The composition according to claim 1, wherein the HMP metal or metal alloy powder comprises at least one metal selected from the group consisting of Cu, Ni, Co, Fe, Mo, Al, Ag, Au, Pt, Pd, Be, and Rh.

12. The composition according to claim 11, wherein the HMP metal or metal alloy powder comprises copper (Cu).

13. The composition according to claim 1, wherein the metallic component, the fluxing component or both further comprise a low melting point (LMP) metal or metal alloy, wherein the metal alloy is a metal allow powder, and wherein the LMP metal or metal alloy powder comprises at least one metal selected from the group consisting of Sn, Bi, Pb, Cd, Zn, Ga, In, Te, Hg, TI, Sb, Se, and Po.

14. The composition according to claim 13, wherein the LMP metal or metal alloy powder comprises tin (Sn) alloy.

15. The composition according to claim 1, wherein the metallic component further comprises up to about 30% (w/w) of a fluid dispersion medium out of the total weight of the metallic component, which and wherein the fluid dispersion medium is inert to the HMP metal or metal alloy and is selected from the group consisting of a glycol diether, ester, halogenated aromatic compound, and combinations thereof.

16. The composition according to claim 1, wherein the metallic component, the fluxing component or both further comprise at least one additive selected from the group consisting of an adhesion-promoting agent, anti-oxidant agent, and combinations thereof, wherein the adhesion-promoting agent comprises an organic acid having one carboxylic group selected from the group consisting of a resin acid, a fatty acid, and combinations or derivatives thereof.

17. The composition according to claim 1, wherein:
the metallic component comprises:
   from about 35% (w/w) to about 75% (w/w) copper powder;
   from about 25% (w/w) to about 65% (w/w) tin alloy powder, and
the fluxing component comprises:
   from about 5% (w/w) to about 50% (w/w) citric acid or tartaric acid;
   from about 1% (w/w) to about 20% (w/w) resin acid; and
   from about 5% (w/w) to about 60% (w/w) glycol diether.

18. The composition according to claim 1, wherein:
the metallic component comprises:
   from about 35% (w/w) to about 75% (w/w) copper powder;
   from about 25% (w/w) to about 65% (w/w) tin alloy powder, and
the fluxing component comprises:
   from about 5% (w/w) to about 50% (w/w) citric acid;
   from about 0.1% (w/w) to about 20% (w/w) thiourea;
   from about 1% (w/w) to about 20% (w/w) resin acid; and
   from about 5% (w/w) to about 60% (w/w) glycol diether.

19. The composition according to claim 1, wherein:
the metallic component comprises:
   about 100% (w/w) copper powder, and
the fluxing component comprises:
   from about 2% (w/w) to about 30% (w/w) citric acid;
   from about 50% (w/w) to about 80% (w/w) tin alloy powder;
   from about 1% (w/w) to about 20% (w/w) resin acid; and
   from about 3% (w/w) to about 30% (w/w) glycol diether.

20. The composition according to claim 1, comprising, following mixing of the two separate components:
   from about 20% (w/w) to about 60% (w/w) copper powder;
   from about 15% (w/w) to about 55% (w/w) tin alloy powder;
   from about 5% (w/w) to about 20% (w/w) citric or tartaric acid;
   from about 5% (w/w) to about 20% (w/w) glycol diether; and
   from about 1% (w/w) to about 10% (w/w) thiourea.

21. The composition according to claim 1, comprising, following mixing of the two separate components:
   from about 20% (w/w) to about 60% (w/w) copper powder;
   from about 15% (w/w) to about 55% (w/w) tin alloy powder;
   from about 5% (w/w) to about 20% (w/w) citric or tartaric acid;
   from about 5% (w/w) to about 20% (w/w) glycol diether;
   from about 0.5 (w/w) to about 5% (w/w) resin acid; and
   from about 1% (w/w) to about 10% (w/w) thiourea.

22. A kit comprising the composition according to claim 1, wherein the metallic component and the fluxing component are disposed in separate containers.

23. The kit according to claim 22, further comprising instructions for mixing the metallic component with the fluxing component, wherein the instructions direct that the weight ratio of the metallic component and the fluxing component ranges from about 20:1 to about 2:1 and that the mixture of the metallic component and the fluxing component is used for printing within less than about 24 hours following the mixing.

24. A method for deposition and patterning of the two-component conductive composition according to claim 1, comprising:
   a) mixing the metallic component with the fluxing component;
   b) applying the mixture obtained in step (a) to an insulating substrate;
   c) heating the applied mixture to a sintering temperature for a period of time sufficient to sinter the conductive composition.

25. The method according to claim 24, wherein the weight ratio of the metallic component and the fluxing component in step (a) ranges from about 20:1 to about 2:1 and the time period between step (a) and step (b) is less than about 24 hours.

26. A printed electronic device comprising at least one conductive trace obtained by the method according to claim 24, wherein the thickness of said conductive trace ranges from about 1 μm to about 30 μm.

* * * * *